US012757434B2

(12) United States Patent
Oh et al.

(10) Patent No.: US 12,757,434 B2
(45) Date of Patent: Oct. 6, 2026

(54) SEMICONDUCTOR DEVICE

(71) Applicant: SAMSUNG ELECTRONICS CO., LTD., Suwon-si (KR)

(72) Inventors: Youngtaek Oh, Suwon-si (KR); Jiwoong Kim, Suwon-si (KR); Taehun Kim, Suwon-si (KR); Minkyung Bae, Suwon-si (KR); Seungjae Baik, Suwon-si (KR); Jaeduk Lee, Suwon-si (KR); Doohee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 249 days.

(21) Appl. No.: 18/629,093

(22) Filed: Apr. 8, 2024

(65) Prior Publication Data

US 2025/0040176 A1 Jan. 30, 2025

(30) Foreign Application Priority Data

Jul. 24, 2023 (KR) ........................ 10-2023-0096406

(51) Int. Cl.

| | |
|---|---|
| ***H10D 30/63*** | (2025.01) |
| ***H10B 80/00*** | (2023.01) |
| ***H10D 62/13*** | (2025.01) |
| ***H10D 62/17*** | (2025.01) |
| ***H10W 90/00*** | (2026.01) |

(52) U.S. Cl.

CPC ............. *H10D 30/63* (2025.01); *H10B 80/00* (2023.02); *H10D 62/149* (2025.01); *H10D 62/292* (2025.01); *H10W 90/00* (2026.01); *H10W 90/792* (2026.01)

(58) Field of Classification Search

CPC .... H10D 30/63; H10D 62/292; H10D 62/149; H10B 80/00; H10W 90/00; H10W 90/792

USPC .......................................................... 257/329

See application file for complete search history.

(56) References Cited

U.S. PATENT DOCUMENTS

| | | | | |
|---|---|---|---|---|
| 10,586,797 | B2 * | 3/2020 | Kim | H10D 30/63 |
| 10,629,616 | B1 | 4/2020 | Kai et al. | |
| 10,644,020 | B2 * | 5/2020 | Huo | H10D 62/17 |
| 10,804,279 | B2 | 10/2020 | Hu et al. | |
| 11,158,622 | B1 | 10/2021 | Zhang | |

(Continued)

FOREIGN PATENT DOCUMENTS

| | | |
|---|---|---|
| CN | 111758164 | 10/2020 |
| CN | 114388517 | 4/2022 |
| KR | 10-2023-0006323 | 1/2023 |

*Primary Examiner* — Tu-Tu V Ho
(74) *Attorney, Agent, or Firm* — Fish & Richardson P.C.

(57) ABSTRACT

A semiconductor device includes a peripheral circuit structure and a cell structure stacked on the peripheral circuit structure. The cell structure includes a plurality of gate electrodes spaced apart from each other in a vertical direction, a channel structure passing through the plurality of gate electrodes and extending in the vertical direction, the channel structure having a first end close to the peripheral circuit structure and a second end opposite to the first end, and a common source layer covering the second end of the channel structure. The channel structure includes a channel layer extending in the vertical direction, the common source layer includes a first region and a second region that contain impurities of different conductivity types, and the first region of the common source layer is connected to at least a portion of the channel layer.

20 Claims, 32 Drawing Sheets

(56) References Cited

U.S. PATENT DOCUMENTS

| | | | | |
|---|---|---|---|---|
| 11,508,750 | B2 | 11/2022 | Zhang et al. | |
| 12,532,465 | B2 * | 1/2026 | Hwang .................. | H10B 41/46 |
| 2019/0296041 | A1 | 9/2019 | Yamasaka et al. | |
| 2022/0157839 | A1 | 5/2022 | Lee | |
| 2022/0310644 | A1 | 9/2022 | Lee et al. | |
| 2022/0406811 | A1 | 12/2022 | Arai | |
| 2023/0005952 | A1 | 1/2023 | Choi et al. | |
| 2023/0062321 | A1 | 3/2023 | Wang et al. | |

* cited by examiner

II–II'

SEMICONDUCTOR DEVICE

CROSS-REFERENCE TO RELATED APPLICATION

This application claims priority to and the benefit of Korean Patent Application No. 10-2023-0096406, filed in the Korean Intellectual Property Office on Jul. 24, 2023, the disclosure of which is incorporated herein by reference in its entirety.

BACKGROUND

In electronic systems that require data storage, semiconductor devices capable of storing large amounts of data are required. In order to achieve superior performance and affordable prices demanded by consumers while increasing data storage capacities, there is a need to increase the integration of semiconductor devices. In the case of 2-dimensional or planar semiconductor devices, the degree of integration is determined by the area occupied by a unit memory cell and is affected by the level of fine pattern formation technology. However, ultra-expensive equipment is required to make fine patterns. Accordingly, although the degree of integration of 2-dimensional semiconductor devices is increasing, the increase in degree of integration is still limited. Therefore, 3-dimensional semiconductor memory devices having memory cells arranged three-dimensionally have been proposed.

SUMMARY

In general, in some aspects, the present disclosure is directed to a semiconductor device having improved electrical properties and reliability, and an improved degree of integration.

According to some aspects of the present disclosure, a semiconductor device includes a peripheral circuit structure and a cell structure stacked on the peripheral circuit structure and a cell region, a connection region located next to the cell region in a first horizontal direction, and a peripheral circuit connection region surrounding the cell region and the connection region, wherein the cell structure includes gate electrodes arranged in the cell region and spaced apart from each other in a vertical direction, a channel structure passing through the gate electrodes in the cell region and extending in the vertical direction, the channel structure having a first end close to the peripheral circuit structure and a second end opposite to the first end, and a common source layer disposed above the gate electrodes and covering the second end of the channel structure, wherein the channel structure includes a channel layer extending in the vertical direction, the common source layer includes a first region and a second region that contain impurities of different conductivity types, and the first region of the common source layer is connected to at least a portion of the channel layer.

According to some aspects of the present disclosure, a semiconductor device includes a peripheral circuit structure and a cell structure stacked on the peripheral circuit structure, wherein the cell structure includes gate electrodes spaced apart from each other in a vertical direction, a channel structure passing through the gate electrodes and extending in the vertical direction, the channel structure having a first end close to the peripheral circuit structure and a second end opposite to the first end, and a common source layer disposed above the gate electrodes and covering the second end of the channel structure, wherein the common source layer includes a plurality of first regions each of a first conductivity type and extending in a first horizontal direction and a plurality of second regions each of a second conductivity type different from the first conductivity type and extending in the first horizontal direction, wherein the first regions and the second regions are alternately arranged in a second horizontal direction crossing the first horizontal direction.

According to some aspects of the present disclosure, a semiconductor device includes a peripheral circuit structure and a cell structure stacked on the peripheral circuit structure and including a cell region, a connection region, and a peripheral circuit connection region, wherein the cell structure includes gate electrodes arranged in the cell region and spaced apart from each other in a vertical direction, a channel structure passing through the gate electrodes in the cell region and extending in the vertical direction, the channel structure having a first end close to the peripheral circuit structure and a second end opposite to the first end, a pad portion having a step shape and extending from the gate electrodes in the connection region, a first plug connected to the pad portion, passing through the pad portion, and extending in the vertical direction, a stack insulating layer surrounding the gate electrodes in a plan view, a second plug passing through the stack insulating layer in the peripheral circuit connection region and extending in the vertical direction, and a common source layer located in the cell region and covering the second end of the channel structure, wherein the channel structure includes a channel layer extending in the vertical direction, the common source layer includes a first region and a second region that contain impurities of different conductivity types, and the first region of the common source layer includes a P-type conductivity and is connected to at least a portion of the channel layer.

BRIEF DESCRIPTION OF THE DRAWINGS

Exemplary implementations will be more clearly understood from the following detailed description, taken in conjunction with the accompanying drawings.

DETAILED DESCRIPTION OF THE EMBODIMENTS

Hereinafter, exemplary implementations will be described in detail with reference to the accompanying drawings.

Figure 1:
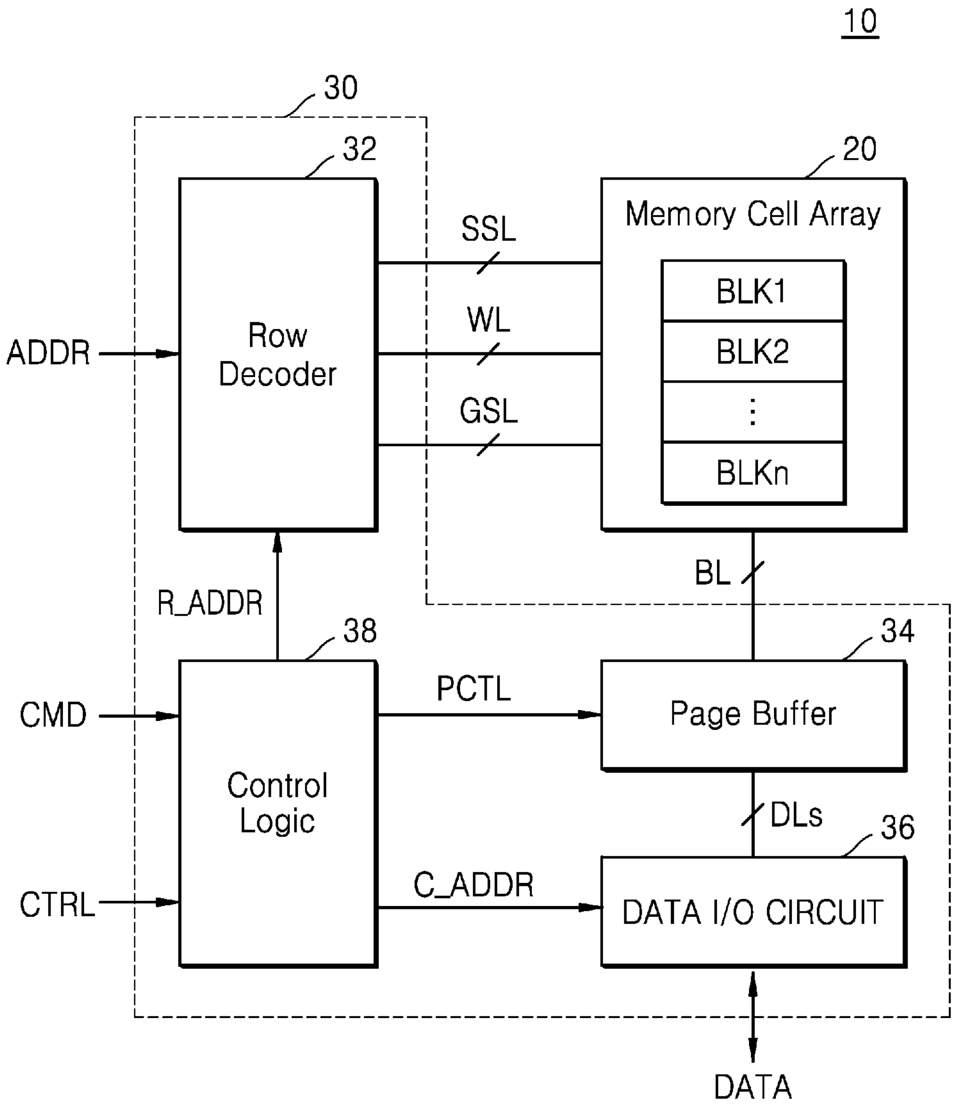
FIG. 1 is a block diagram of an exemplary semiconductor device according to some implementations.

FIG. 1 is a block diagram of an exemplary semiconductor device according to some implementations. In FIG. 1, the semiconductor device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The memory cell blocks BLK1, BLK2, . . . , BLKn may be connected to the peripheral circuit 30 via a bit line BL, a word line WL, a string selection line SSL, and a ground selection line GSL.

The peripheral circuit 30 may include a row decoder 32, a page buffer 34, a data input/output circuit 36, and a control logic 38. Although not shown in FIG. 1, the peripheral circuit 30 may further include an input/output interface, a column logic, a voltage generator, a pre-decoder, a temperature sensor, a command decoder, an address decoder, an amplifier circuit, etc.

The memory cell array 20 may be connected to the page buffer 34 via the bit line BL and connected to the row decoder 32 via the word line WL, the string selection line SSL, and the ground selection line GSL. In the memory cell array 20, the plurality of memory cells of the plurality of memory cell blocks BLK1, BLK2, . . . , BLKn may each include a flash memory cell. The memory cell array 20 may include a 3-dimensional memory cell array. The 3-dimensional memory cell array may include a plurality of negative-AND (NAND) strings, and each of the NAND strings may include a plurality of memory cells connected to a plurality of word lines WL vertically stacked on a substrate.

The peripheral circuit 30 may be configured to receive an address ADDR, a command CMD, and a control signal CTRL from the outside of the semiconductor device 10 and may transmit data DATA to or receive the data DATA from a device external to the semiconductor device 10.

The row decoder 32 may be configured to select at least one of the plurality of memory cell blocks BLK1, BLK2, . . . , BLKn in response to an address ADDR from the outside of the row decoder 32 and may select the word line WL, the string selection line SSL, and the ground selection line GSL of the selected memory cell block. The row decoder 32 may be configured to transmit a voltage for performing a memory operation to the word line WL of the selected memory cell block.

The page buffer 34 may be connected to the memory cell array 20 via the bit line BL. The page buffer 34 may be configured to operate as a write driver during a program operation and apply a voltage to the bit line BL according to the data DATA to be stored in the memory cell array 20, and the page buffer 34 may be configured to operate as a sensing amplifier during a read operation and sense data stored in the memory cell array 20. The page buffer 34 may be configured to operate according to a control signal PCTL provided from the control logic 38.

The data input/output circuit 36 may be connected to the page buffer 34 via data lines DLs. The data input/output circuit 36 may be configured to receive data DATA from a memory controller (not shown) during the program operation and may provide program data DATA to the page buffer 34 on the basis of a column address C_ADDR provided from the control logic 38. The data input/output circuit 36 may be configured to provide read data DATA stored in the page buffer 34 to the memory controller on the basis of the column address C_ADDR provided from the control logic 38 during the read operation.

The data input/output circuit 36 may be configured to transmit an input address or command to the control logic 38 or the row decoder 32. The peripheral circuit 30 may further include an electro-static discharge (ESD) circuit and a pull-up/pull-down driver.

The control logic 38 may be configured to receive a command CMD and a control signal CTRL from the memory controller. The control logic 38 may be configured to provide a row address R_ADDR to the row decoder 32 and the column address C_ADDR to the data input/output circuit 36. In response to the control signal CTRL, the control logic 38 may be configured to generate various internal control signals used inside the semiconductor device 10. For example, the control logic 38 may adjust a voltage level provided to the word line WL and the bit line BL, when performing a memory operation, such as a program operation or an erase operation.

Figure 2:
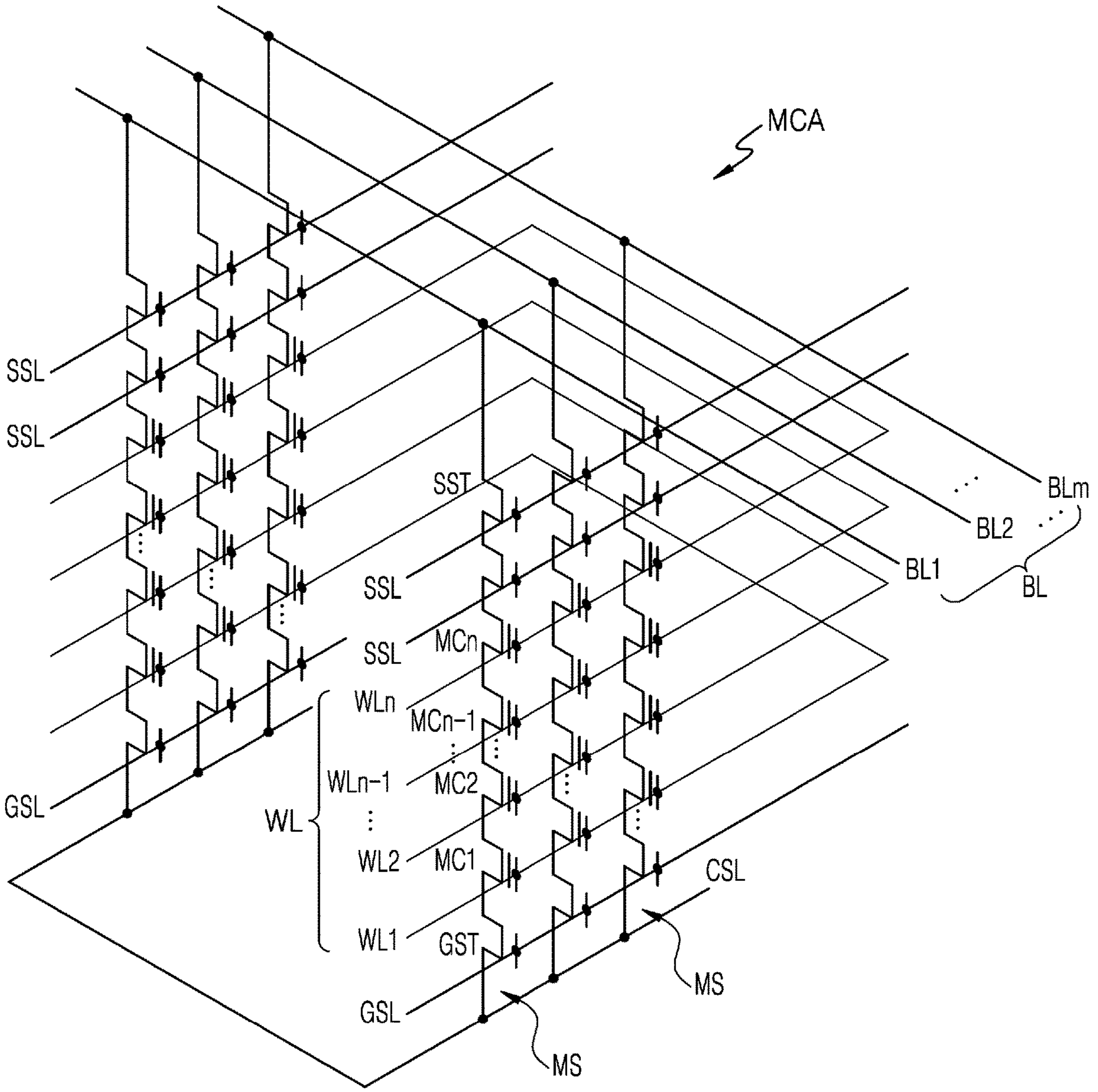
FIG. 2 is a circuit diagram showing an exemplary memory block according to some implementations.

FIG. 2 is a circuit diagram showing an exemplary memory block BLK according to some implementations. In FIG. 2, a memory cell array MCA may include a plurality of memory cell strings MS. The memory cell array MCA may include a plurality of bit lines BL (BL1, BL2, . . . , BLm), a plurality of word lines WL (WL1, WL2, . . . , WLn−1, and WLn), at least one string selection line SSL, at least one ground selection line GSL, and a common source line CSL. A plurality of memory cell strings MS may be formed between the plurality of bit lines BL (BL1, BL2, . . . , BLm) and the common source line CSL. Although FIG. 2 illustrates a case in which each of the plurality of memory cell strings MS includes two string selection lines SSL, some implementations are not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn−1, and MCn. A drain region of the string selection transistor SST may be connected to the bit lines BL (BL1, BL2, . . . , BLm), and the source region of the ground selection transistor GST may be connected to the common source line CSL. The common source line CSL may have a region to which source regions of a plurality of ground selection transistors GST are connected in common.

The string selection transistor SST may be connected to the string selection line SSL, and the ground selection transistor GST may be connected to the ground selection line GSL. A plurality of memory cell transistors MC1, MC2, . . . , MCn−1, and MCn may be connected to a plurality of word lines WL (WL1, WL2, . . . , WLn−1, and WLn), respectively.

Figure 3:
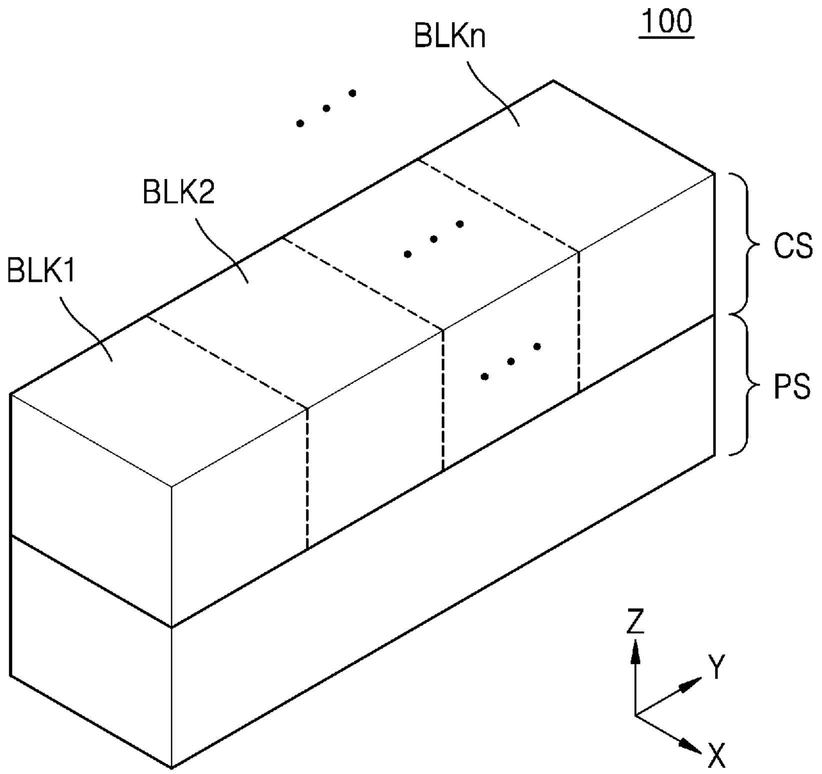
FIG. 3 is a perspective view showing an exemplary configuration of a semiconductor device according to some implementations.
Figure 4:
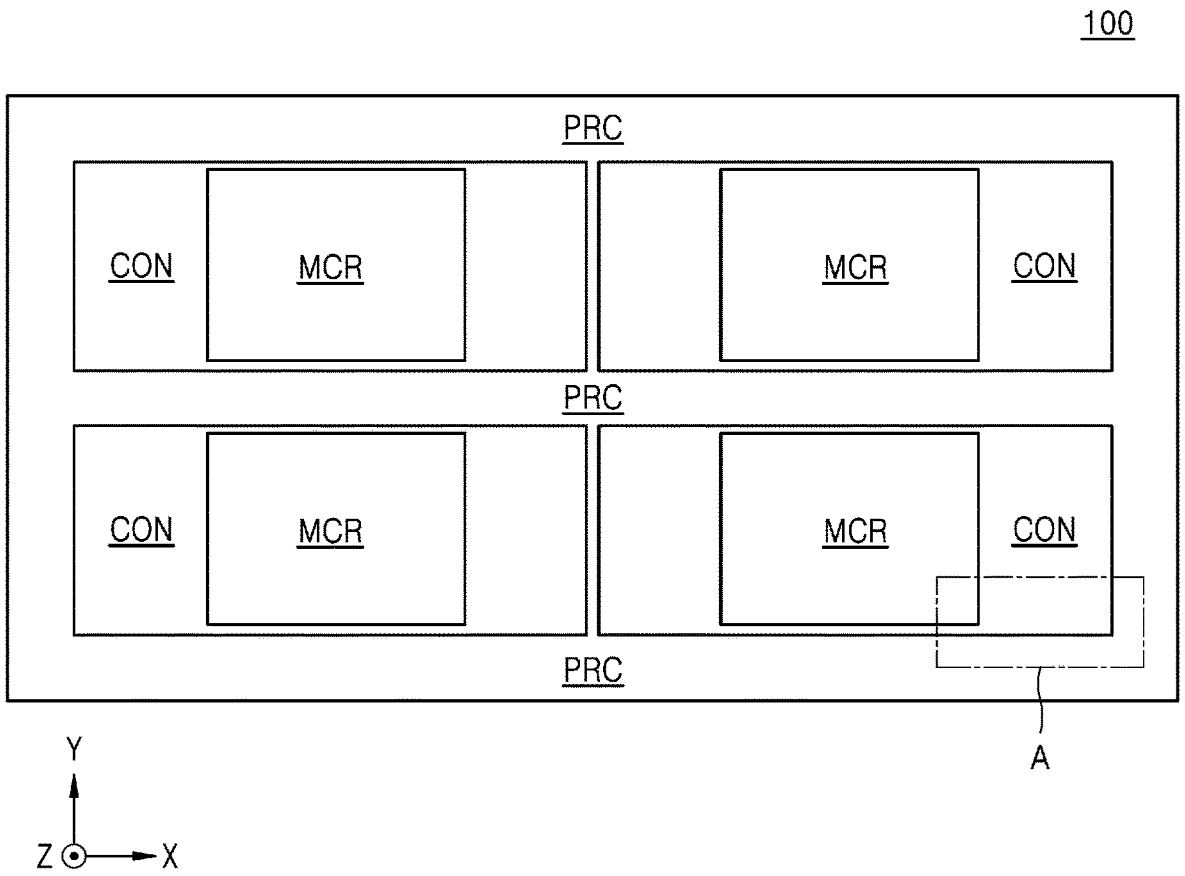
FIG. 4 is a plan layout view of the semiconductor device of FIG. 3.
Figure 5:
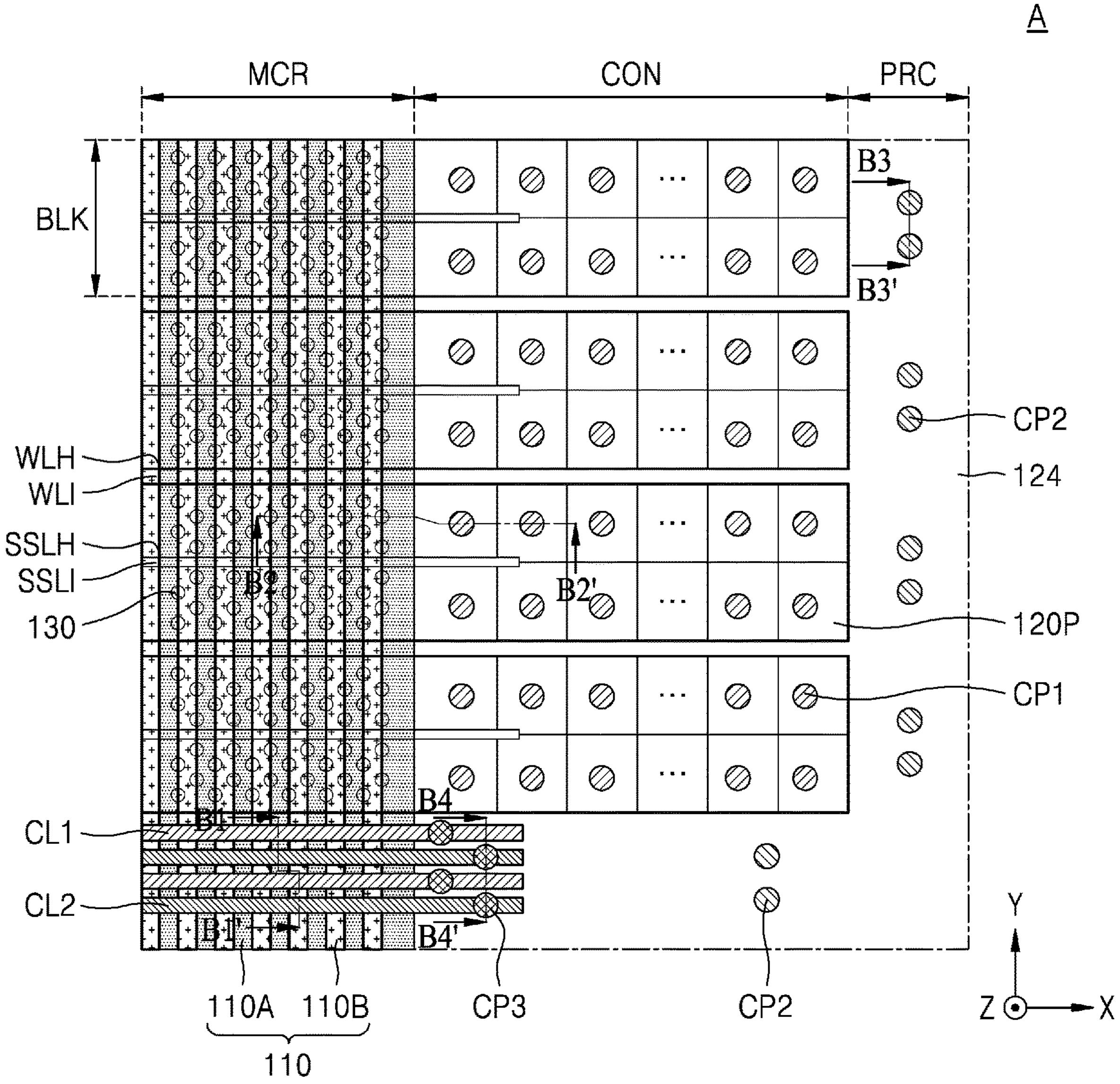
FIG. 5 is an enlarged layout view of region A of FIG. 4.
Figure 6A:
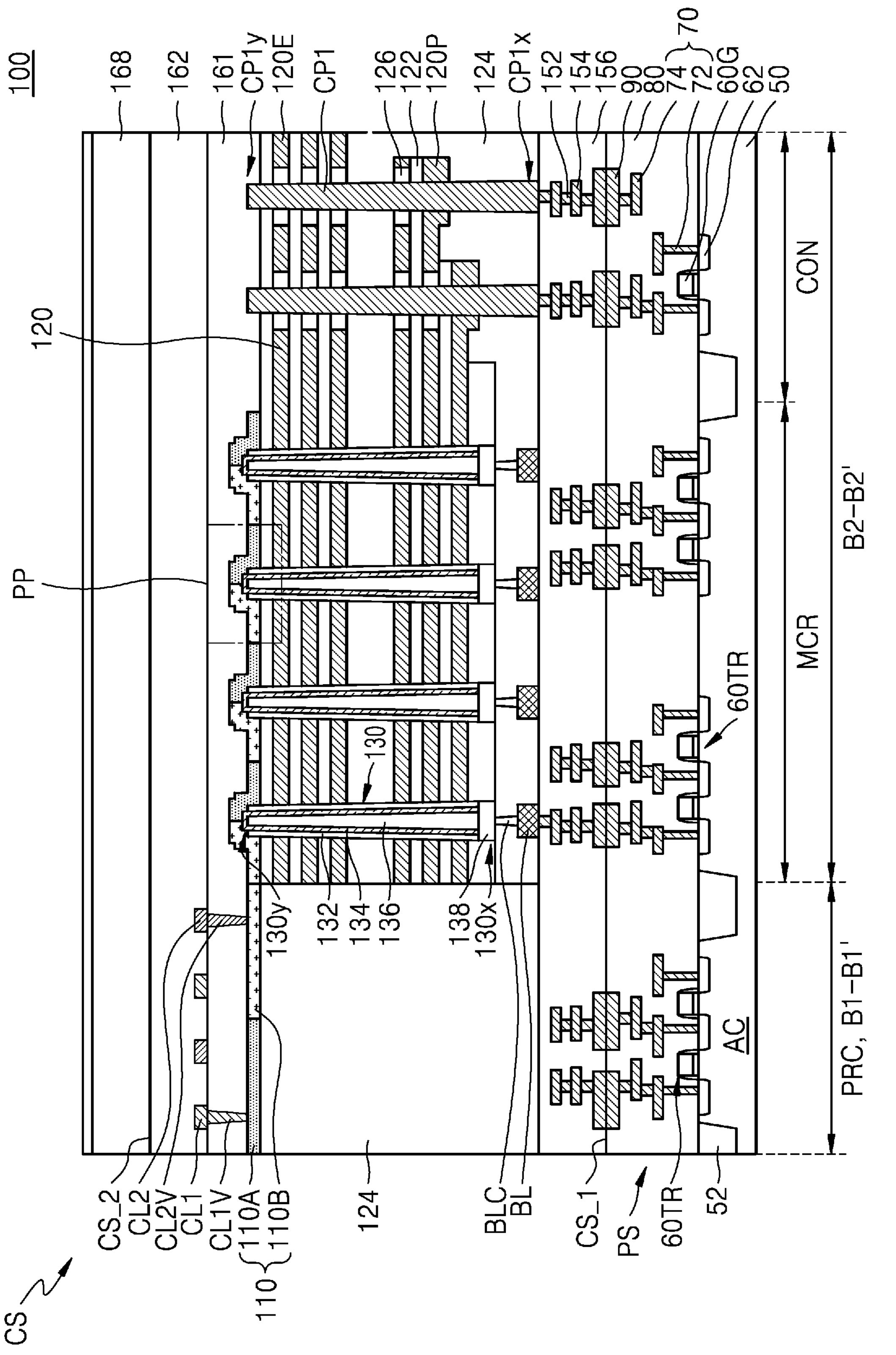
FIG. 6A is a cross-sectional view taken along lines B1-B1' and B2-B2' of FIG. 5.
Figure 6B:
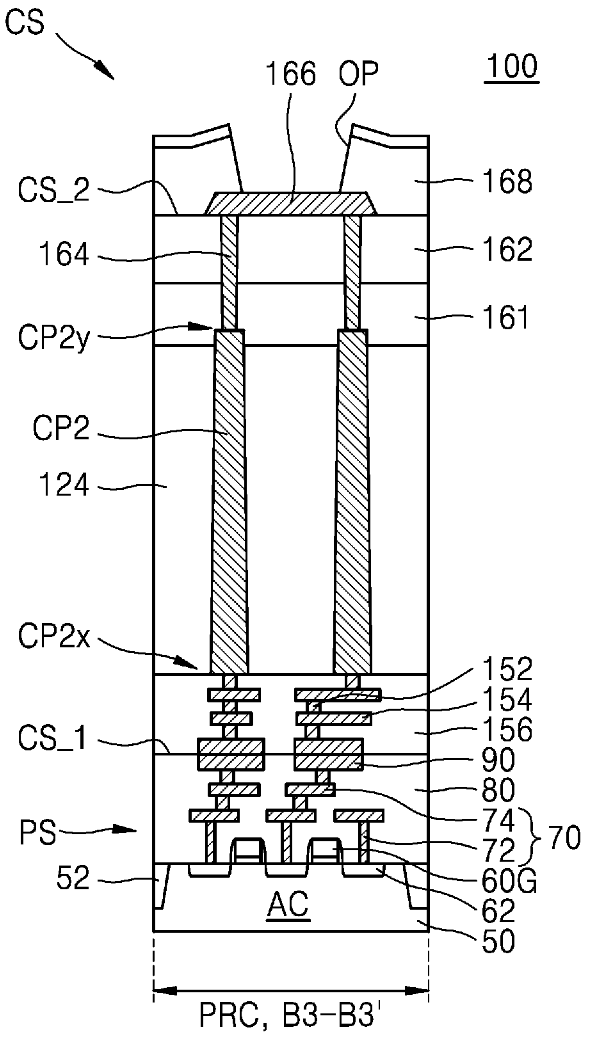
FIG. 6B is a cross-sectional view taken along line B3-B3' of FIG. 5.
Figure 6C:
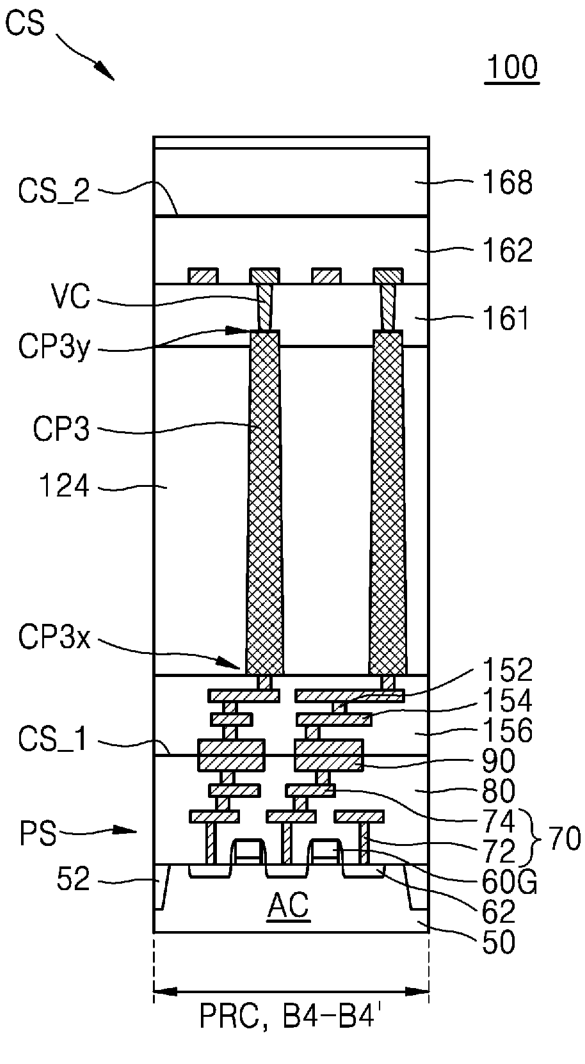
FIG. 6C is a cross-sectional view taken along line B4-B4' of FIG. 5.
Figure 6D:
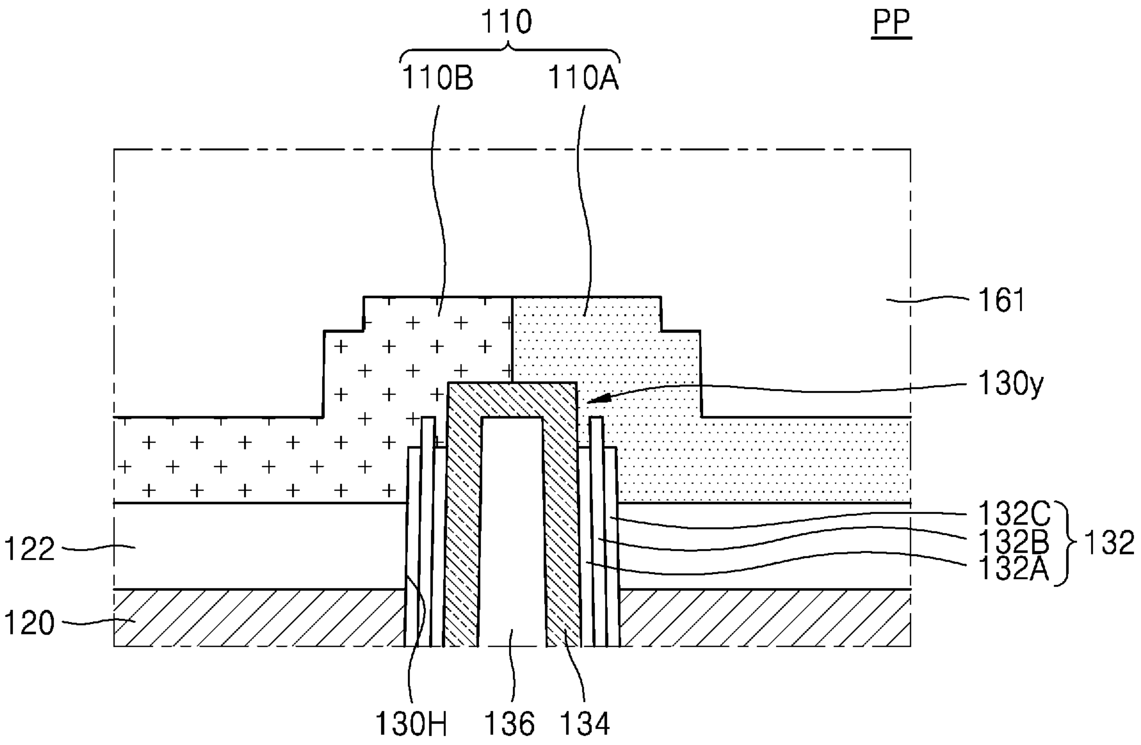
FIG. 6D is an enlarged view of region PP of FIG. 6A.

FIG. 3 is a perspective view of an exemplary configuration of a semiconductor device according to some implementations. FIG. 4 is a plan layout view of the semiconductor device 100 of FIG. 3. FIG. 5 is an enlarged layout view of region A of FIG. 4. FIG. 6A is a cross-sectional view taken along lines B1-B1' and B2-B2' of FIG. 5. FIG. 6B is a cross-sectional view taken along line B3-B3' of FIG. 5. FIG. 6C is a cross-sectional view taken along line B4-B4' of FIG. 5. FIG. 6D is an enlarged view of region PP of FIG. 6A.

Referring to FIGS. 3 to 6D, the semiconductor device 100 includes a cell structure CS and a peripheral circuit structure PS that overlap each other in a vertical direction Z. The cell structure CS may include the memory cell array 20, as described with reference to FIG. 1, and the peripheral circuit structure PS may include the peripheral circuit 30, as described with reference to FIG. 1. In FIGS. 3 to 6D, a first horizontal direction X is defined as a direction parallel to the upper surface of a substrate 50, a second horizontal direction Y is defined as a direction parallel to the upper surface of the substrate 50 and crossing the first horizontal direction X, and a vertical direction Z is defined as a direction perpendicular to the upper surface of the substrate 50.

The cell structure CS may include a plurality of memory cell blocks BLK1, BLK2, . . . . BLKn. Each of the plurality of memory cell blocks BLK1, BLK2, . . . , BLKn may include memory cells arranged three-dimensionally.

In FIG. 6A, the peripheral circuit structure PS may include a peripheral circuit transistor 60TR and a peripheral circuit wiring structure 70, which are arranged on the substrate 50. An active region AC may be defined in the substrate 50 by an element isolation film 52, and a plurality of peripheral circuit transistors 60TR may be formed on the active region AC. The plurality of peripheral circuit transistors 60TR may each include a peripheral circuit gate 60G and source/drain regions 62 arranged in portions of the substrate 50 on both sides of the peripheral circuit gate 60G.

The substrate 50 may include a semiconductor material, such as a group IV semiconductor, a group III-V compound semiconductor, or a group II-VI oxide semiconductor. For example, the group IV semiconductor may include silicon (Si), germanium (Ge), or silicon-germanium. The substrate 50 may be provided as a bulk wafer or an epitaxial layer. In some embodiments, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. A first interlayer insulating film 80 may be disposed on the substrate 50 to cover the peripheral circuit transistor 60TR and the peripheral circuit wiring structure 70. The plurality of peripheral circuit wiring layers 74 may have a multilayer structure including a plurality of metal layers arranged at different vertical levels. A connection pad 90 may be disposed in the first interlayer insulating film 80, and the peripheral circuit structure PS and the cell structure CS may be electrically connected and bonded to each other by the connection pad 90.

The cell structure CS may include a cell region MCR, a connection region CON, and a peripheral circuit connection region PRC. In FIG. 4, the connection region CON may be next to the cell region MCR in the first horizontal direction X, and the peripheral circuit connection region PRC may surround the cell region MCR and the connection region CON. The cell region MCR may include a region in which a memory cell block BLK including a plurality of memory cell strings that extend in the vertical direction Z is located. In FIG. 6A, the cell region MCR may include a common source layer 110, gate electrodes 120, and a channel structure 130 passing through the gate electrodes 120, extending in the vertical direction Z, and connected to the common source layer 110. The connection region CON may include an extension portion 120E and a pad portion 120P, which are connected to the plurality of gate electrodes 120, and a first plug CP1, which passes through the extension portion 120E and the pad portion 120P and is electrically connected to the pad portion 120P. The peripheral circuit connection region PRC may include a second plug CP2 extending in the vertical direction Z and electrically connected to the peripheral circuit wiring structure 70.

The cell structure CS may include a first surface CS_1 connected to the peripheral circuit structure PS and a second surface CS_2 opposite to the first surface CS_1. In FIG. 6A, the first surface CS_1 of the cell structure CS is shown on the lower side of the cell structure CS, and the second surface CS_2 of the cell structure CS is shown on the upper side of the cell structure CS. Here, a part close to the first surface CS_1 of the cell structure CS is referred to as a part at a lower vertical level and a part close to the second surface CS_2 of the cell structure CS is referred to as a part at a higher vertical level.

The gate electrodes 120 may be spaced apart from each other in the vertical direction Z in the cell region MCR, and the gate electrodes 120 may be alternately arranged with mold insulating layers 122. The gate electrodes 120 may extend to the connection region CON, and portions of the gate electrodes 120 located in the connection region CON may be referred to as extension portions 120E. The extension portions 120E may have a horizontal length that gradually increases in a direction toward the second surface CS_2 of the cell structure CS (that is, in an upward direction). The extension portions 120E may each have a step shape, and pad portions 120P may be connected to ends of the extension portions 120E. The pad portions 120P may have a thickness in the vertical direction Z greater than that of the extension portions 120E.

Although not shown, the gate electrodes 120 may include a buried conductive layer and a conductive barrier layer surrounding the top, bottom, and side surfaces of the buried conductive layer. For example, the buried conductive layer may include metal, such as tungsten, nickel, cobalt, and tantalum, metal silicide, such as tungsten silicide, nickel silicide, cobalt silicide, and tantalum silicide, doped polysilicon, or a combination thereof. In some embodiments, the conductive barrier layer may include titanium nitride, tantalum nitride, tungsten nitride, or a combination thereof.

In some implementations, the gate electrodes 120 may correspond to the ground selection line GSL, the word lines WL (WL1, WL2, . . . , WLn−1, and WLn), and at least one string selection line SSL, which constitute the memory cell string MS (see FIG. 2). For example, an uppermost gate electrode 120 may function as the ground selection line GSL, bottom two gate electrodes 120 may function as the string selection lines SSL, and the remaining gate electrodes 120 may function as the word lines WL. Accordingly, the memory cell string MS may be provided, in which the ground selection transistor GST, the string selection transistor SST, and the memory cell transistors MC1, MC2, . . . , MCn−1, and MCn between the ground selection transistor GST and the string selection transistor SST are connected to each other in series. In some implementations, at least one of the gate electrodes 120 may function as a dummy word line, but in some implementations it is not limited thereto.

In FIGS. 5 and 6A, a stack separation insulating layer WLI may be located inside a stack separation opening WLH passing through the gate electrodes 120 and the mold insulating layers 122 and extending in the vertical direction Z. Although not shown, the stack separation insulating layer WLI may have an upper surface at a vertical level higher than an uppermost gate electrode 120 and may protrude upward from the uppermost gate electrode 120. As shown in FIG. 5, the gate electrodes 120 arranged between a pair of stack separation openings WLH may form one block BLK. In addition, at least one gate electrode 120 (e.g., a lowermost gate electrode 120) inside one block BLK may be separated into two gate electrodes 120 by a string separation opening SSLH. A string separation insulating layer SSLI may be located inside the string separation opening SSLH.

In the connection region CON and the peripheral circuit connection region PRC, a stack insulating layer 124 may be provided to surround the gate electrodes 120, the extension portions 120E, and the pad portions 120P. In a plan view, the stack insulating layer 124 may surround the gate electrodes 120. In the peripheral circuit connection region PRC, the upper surface of the stack insulating layer 124 may be at the same level as the upper surface of an uppermost mold insulating layer among the mold insulating layers 122.

In FIG. 6A, the channel structure 130 may include a first end 130*x* close to the peripheral circuit structure PS and a second end 130*y* opposite to the first end 130*x*. In some implementations, the channel structure 130 may have inclined sidewalls such that the width of the first end 130*x* is greater than the width of the second end 130*y*. The bit line BL may be electrically connected to the first end 130*x* of the channel structure 130 via a bit line contact BLC, and the common source layer 110 may be connected to the second end 130*y* of the channel structure 130.

In FIG. 6D, the channel structure 130 may be located in a channel hole 130H passing through the gate electrodes 120 and the mold insulating layers 122 and extending in the vertical direction and may include a gate insulating layer 132, a channel layer 134, a buried insulating layer 136, and a drain region 138. The channel layer 134 may have a cylindrical shape, the gate insulating layer 132 may be located on the outer wall of the channel layer 134, and the buried insulating layer 136 may be located on the inner wall of the channel layer 134. The gate insulating layer 132 may not be disposed on the uppermost surface of the channel layer 134, for example, on the upper surface of the channel layer 134 located at the second end 130*y* of the channel structure 130.

In FIG. 6D, the gate insulating layer 132 may have a structure including a tunneling dielectric layer 132A, a charge storage layer 132B, and a blocking dielectric layer 132C, which are provided in this order on the outer wall of the channel layer 134. The relative thicknesses of the tunneling dielectric layer 132A, the charge storage layer 132B, and the blocking dielectric layer 132C constituting the gate insulating layer 132 are not limited to those illustrated in FIG. 6D and may be modified.

The tunneling dielectric layer 132A may include silicon oxide, hafnium oxide, aluminum oxide, zirconium oxide, tantalum oxide, etc. The charge storage layer 132B may have a region capable of storing electrons passing through the tunneling dielectric layer 132A from the channel layer 134 and may include silicon nitride, boron nitride, silicon boron nitride, or polysilicon doped with impurities. The blocking dielectric layer 132C may include silicon oxide, silicon nitride, or metal oxide with a dielectric constant greater than that of the silicon oxide. The metal oxide may include hafnium oxide, aluminum oxide, zirconium oxide, tantalum oxide, or a combination thereof.

In FIG. 6A, the common source layer 110 may be disposed on the uppermost mold insulating layer 122. The common source layer 110 may be formed conformally and connected to the second end 130*y* of the channel structure 130. Although not shown, the common source layer 110 may cover the upper surface of the stack separation insulating layer WLI. In a plan view, the common source layer 110 may be provided in the entire cell region MCR. The common source layer 110 may not be provided on the connection region CON. The common source layer 110 extends in the second horizontal direction Y and may be provided to at least a portion of the peripheral circuit connection region PRC. A portion of the common source layer 110 may have an upper surface that is at a vertical level different from that of another portion of the common source layer 110 in contact with the second end 130*y* of the channel structure 130.

In some implementations, as shown in FIG. 6D, the common source layer 110 may conformally cover the upper surface of the channel layer 134 and the upper surface of the gate insulating layer 132. For example, the gate insulating layer 132 may be at a lower level than the upper surface of the channel layer 134, in which a portion of the upper surface and sidewalls of the channel layer 134 are covered by the common source layer 110, such that a sufficient contact area between the channel layer 134 and the common source layer 110 may be obtained. In some implementations, as shown in FIG. 6D, the upper surface of the charge storage layer 132B may protrude upward from the upper surfaces of the tunneling dielectric layer 132A and the blocking dielectric layer 132C. However, the shape of the gate insulating layer 132 is not limited to that shown in FIG. 6D. In some implementations, the upper surface of the charge storage layer 132B may be at the same level as the upper surfaces of the tunneling dielectric layer 132A and the blocking dielectric layer 132C, such that an upper surface of the gate insulating layer 132 may have a flat horizontal level.

The common source layer 110 may have a first region 110A and a second region 110B. The first region 110A and the second region 110B may include parts of the common source layer 110 doped with impurities of different conductivity types. For example, the first region 110A may be doped with first conductivity-type impurities (e.g., boron (B) atoms), and the first conductivity type may include P type. The second region 110B may be doped with second conductivity-type impurities (e.g., phosphorus (P) atoms), and the second conductivity type may include N type. As shown in FIG. 5, each of the first region 110A and the second region 110B may extend in the second horizontal direction Y.

Each of the first region 110A and the second region 110B may be provided in plurality. The plurality of first regions 110A and the plurality of second regions 110B may be alternately arranged in the first horizontal direction X. The two first regions 110A may be adjacent to each other in the first horizontal direction X with at least one second region 110B therebetween. The two second regions 110B may be adjacent to each other in the first horizontal direction X with at least one first region 110A therebetween.

The first region 110A may be in contact with the channel layer 134 located at the second end 130*y* of the channel structure 130. The first region 110A may cover at least a portion of the upper surface and at least a portion of the sidewall of the channel layer 134 located at the second end 130*y* of the channel structure 130.

The second region 110B may be in contact with the channel layer 134 located at the second end 130*y* of the channel structure 130. The second region 110B may cover at least a portion of the upper surface and at least a portion of the sidewall of the channel layer 134 located at the second end 130*y* of the channel structure 130. Accordingly, the channel layer 134 of the channel structure 130 may be connected to both the first region 110A and the second region 110B. In some implementations, a physical boundary between the first region 110A and the second region 110B may not be observed.

In some implementations, the common source layer 110 may include polysilicon. A laser annealing process may be performed on the common source layer 110, in which the common source layer 110 may have relatively large grain sizes and exhibit relatively excellent crystal qualities.

In the connection region CON, there may be provided the first plug CP1 that passes through the extension portions 120E and the pad portions 120P extending from the gate electrodes 120. Insulating patterns 126 may be formed at positions vertically overlapping the pad portion 120P connected to the first plug CP1. The insulating patterns 126 may be provided between the first plug CP1 and the extension portions 120E.

In some implementations, as shown in FIG. 6A, a third end CP1x of the first plug CP1 may be adjacent to the peripheral circuit structure PS, and a fourth end CP1y of the first plug CP1 may be opposite to the third end CP1x. The first plug CP1 may have inclined sidewalls such that the width of third end CP1x is greater than the width of the fourth end CP1y. The fourth end CP1y of the first plug CP1 may extend through the uppermost mold insulating layer 122, and the upper surface of the fourth end CP1y of the first plug CP1 may be covered by a first upper interlayer insulating film 161.

Although not shown, in some implementations, the first plug CP1 may include a conductive buried layer and a barrier layer having a small thickness and surrounding the upper surface and sidewall of the conductive buried layer. For example, the conductive buried layer may include metal, such as tungsten, nickel, cobalt, and tantalum, metal silicide, such as tungsten silicide, nickel silicide, cobalt silicide, and tantalum silicide, doped polysilicon, or a combination thereof. The barrier layer may include titanium nitride, tantalum nitride, tungsten nitride, or a combination thereof.

In the peripheral circuit connection region PRC, there may be provided a second plug CP2 passing through the stack insulating layer 124, as shown in FIG. 6B. A fifth end CP2x of the second plug CP2 may be adjacent to the peripheral circuit structure PS, and a sixth end CP2y of the second plug CP2 may be opposite to the fifth end CP2x. The second plug CP2 may have inclined sidewalls such that the width of the fifth end CP2x is greater than the width of the sixth end CP2y. The sixth end CP2y of the second plug CP2 may extend through the uppermost mold insulating layer 122, and the upper surface of the sixth end CP2y of the second plug CP2 may be covered by the first upper interlayer insulating film 161.

In the peripheral circuit connection region PRC, there may be provided a third plug CP3 passing through the stack insulating layer 124, as shown in FIG. 6C. The third plug CP3 may be spaced apart from the common source layer 110 in the first horizontal direction X. A seventh end CP3x of the third plug CP3 may be adjacent to the peripheral circuit structure PS, and an eighth end CP3y of the third plug CP3 may be opposite to the seventh end CP3x. The third plug CP3 may have inclined sidewalls such that the width of the seventh end CP3x is greater than the width of the eighth end CP3y. The eighth end CP3y of the third plug CP3 may extend through the uppermost mold insulating layer 122, and the upper surface of the eighth end CP3y of the third plug CP3 may be covered by the first upper interlayer insulating film 161.

In FIG. 6A, a connection via 152, a connection wiring layer 154, and a second interlayer insulating film 156 surrounding the connection via 152 and the connection wiring layer 154 may be arranged between the stack insulating layer 124 and the peripheral circuit structure PS. The connection via 152 and the connection wiring layer 154 may be formed in multiple layers arranged at a plurality of vertical levels and may electrically connect the bit line BL, the first plug CP1, the second plug CP2, and the third plug CP3 to the peripheral circuit structure PS via the connection pad 90.

In the peripheral circuit connection region PRC, a first conductive line CL1 and a second conductive line CL2 may be arranged on the first upper interlayer insulating film 161. The vertical level of the first conductive line CL1 and the second conductive line CL2 may be higher than the vertical level of the channel layer 134. The first conductive line CL1 and the second conductive line CL2 may extend in the first horizontal direction X. The first conductive line CL1 may be connected to at least one of the plurality of first regions 110A of the common source layer 110 by a first conductive via CLIV passing through the first upper interlayer insulating film 161. The second conductive line CL2 may be connected to at least one of the plurality of second regions 110B of the common source layer 110 by a second conductive via CL2V passing through the first upper interlayer insulating film 161. One first conductive line CL1 may be connected to at least one first region 110A, and one second conductive line CL2 may be connected to at least one second region 110B.

The first conductive line CL1 and the second conductive line CL2 may be spaced apart from each other in the second horizontal direction Y. Each of the first conductive line CL1 and the second conductive line CL2 may be provided in one or plurality. When a plurality of first conductive lines CL1 and second conductive lines CL2 are provided, the plurality of first conductive lines CL1 and the plurality of second conductive lines CL2 may be alternately arranged in the second horizontal direction Y. However, in some implements, a plurality of first conductive lines CL1 may be arranged consecutively in the second horizontal direction Y and a plurality of second conductive lines CL2 may be arranged consecutively in the second horizontal direction Y.

Figure 9:
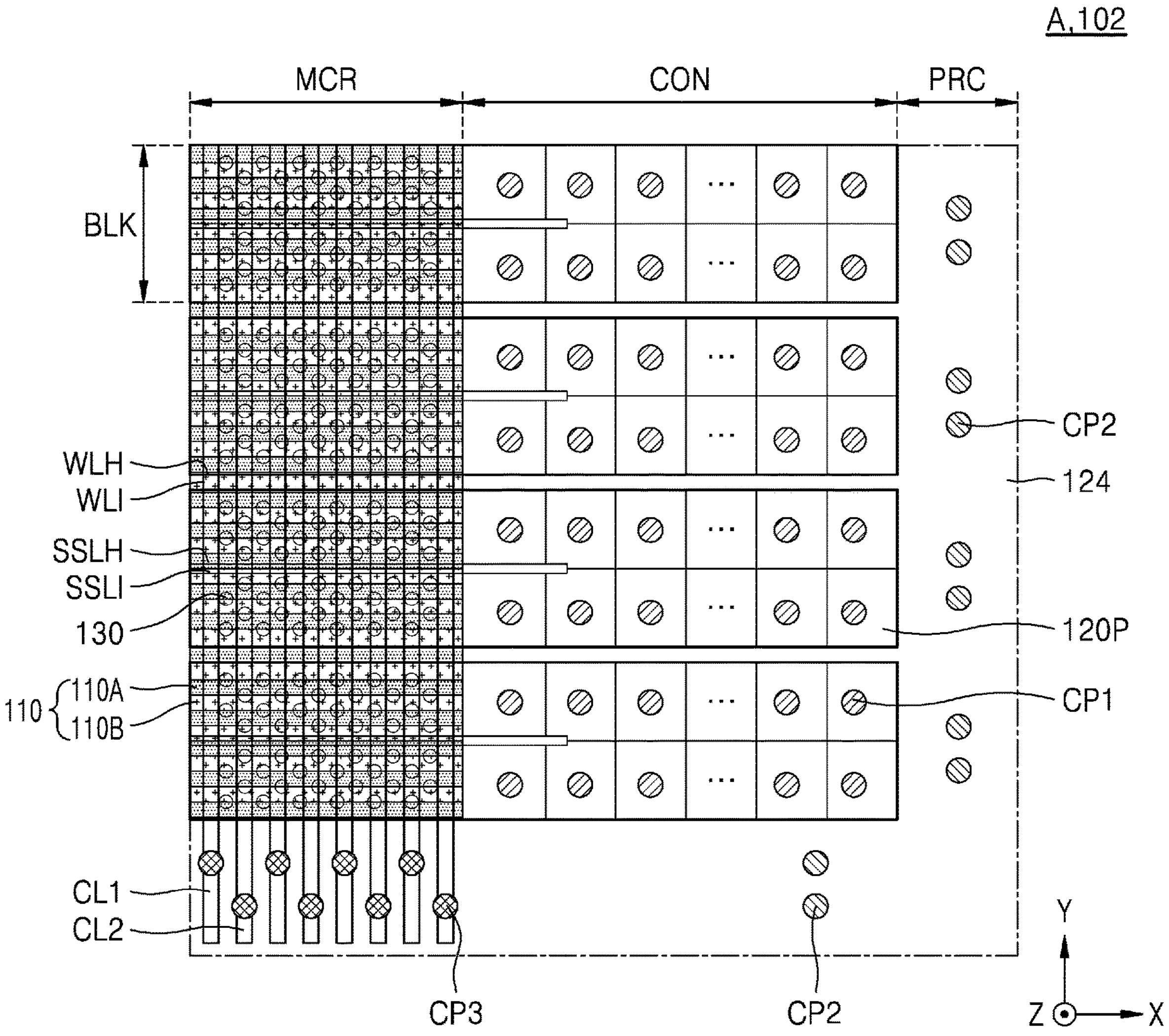
FIG. 9 is an enlarged layout view of region A of FIG. 4.

In FIGS. 6A and 6C, each of the first conductive line CL1 and the second conductive line CL2 may be connected to one of the plurality of third plugs CP3 by a third conductive via VC passing through the first upper interlayer insulating film 161. Each of the first conductive line CL1 and the second conductive line CL2 may be electrically connected to the peripheral circuit structure PS via one of the third plugs CP3. In FIG. 6A and FIG. 9, a first conductive via CLIV connecting the first conductive line CL1 to the first region 110A may be located in the cell region MCR. A second conductive via CL2V connecting the second conductive line CL2 to the second region 110B may be located in the cell region MCR.

In FIG. 6C and FIG. 9, a third plug CP3 and a third conductive via VC may be spaced apart from the common source layer 110 in the second horizontal direction Y but may not be spaced apart from the common source layer 110 in the first horizontal direction X. However, in some implementations, when the first conductive line CL1 and the second conductive line CL2 extend further in the first horizontal direction X in the peripheral circuit connection region PRC, the third plug CP3 and the third conductive via VC may be spaced apart from the common source layer 110 in the first horizontal direction X.

In some implementations, an erase operation of the memory cell string MS (in FIG. 2) constituted by the channel structure 130 may be performed by applying an erase voltage to the first region 110A of the common source layer 110 via the first conductive line CL1. Also, a program operation or a read operation of the memory cell string MS (in FIG. 2) constituted by the channel structure 130 may be performed by applying a program voltage or a read voltage to the second region 110B of the common source layer 110 via the second conductive line CL2.

In FIGS. 6A-6D, a second upper interlayer insulating film 162 may be disposed on the first upper interlayer insulating film 161. The second upper interlayer insulating film 162 may cover the first upper interlayer insulating film 161, the first conductive line CL1, and the second conductive line CL2.

In FIG. 6B, back-side vias 164 may pass through the second upper interlayer insulating film 162. The back-side vias 164 may further extend in the vertical direction Z and then be inserted into the first upper interlayer insulating film 161. Each of the back-side vias 164 may be connected to one of a plurality of second plugs CP2.

In FIG. 6B, back-side pads 166 may be disposed on the second upper interlayer insulating film 162. The back-side pads 166 may be connected to the back-side vias 164. A passivation layer 168 may be disposed on the second upper interlayer insulating film 162, and an opening OP of the passivation layer 168 may expose the upper surfaces of the back-side pads 166.

In general, the peripheral circuit structure PS and the cell structure CS are attached to each other by a bonding process, the common source layer 110 is formed on the upper surface of the cell structure CS by deposition, and the common source layer 110 is doped with N-type impurities (e.g., phosphorus (P) atoms). During the erase operation of the semiconductor device 100, a gate induced drain leakage (GIDL) phenomenon is used by which the common source layer 110 is doped with the N-type impurities. However, when the erase operation of the semiconductor device 100 is performed using the GIDL phenomenon with large numbers of gate electrodes 120 and mold insulating layers 122, a relatively high erase voltage (Vers) is applied to the common source layer 110. Accordingly, the channel structure 130 may be adversely affected and the data retention and endurance of the channel structure 130 may be deteriorated. Accordingly, reliability of the semiconductor device 100 may be deteriorated.

However, according to the above-described implementations, the common source layer 110 may include the first region 110A and the second region 110B, in which the first region 110A may be doped with first conductivity-type impurities and the second region 110B may be doped with second conductivity-type impurities. The first conductivity type may include P type, and the second conductivity type may include N type. Both the first region 110A and the second region 110B may be connected to the channel layer 134 in one channel structure 130. Accordingly, the second region 110B may be used when performing the program operation and read operation of the semiconductor device 100, and the first region 110A may be used when performing the erase operation. In particular, when the first region 110A is used during the erase operation, holes may be supplied to the channel layer 134 from the first region 110A. Accordingly, the erase operation may be performed even with a relatively low erase voltage, compared to the erase operation of the GIDL method.

Figure 7:
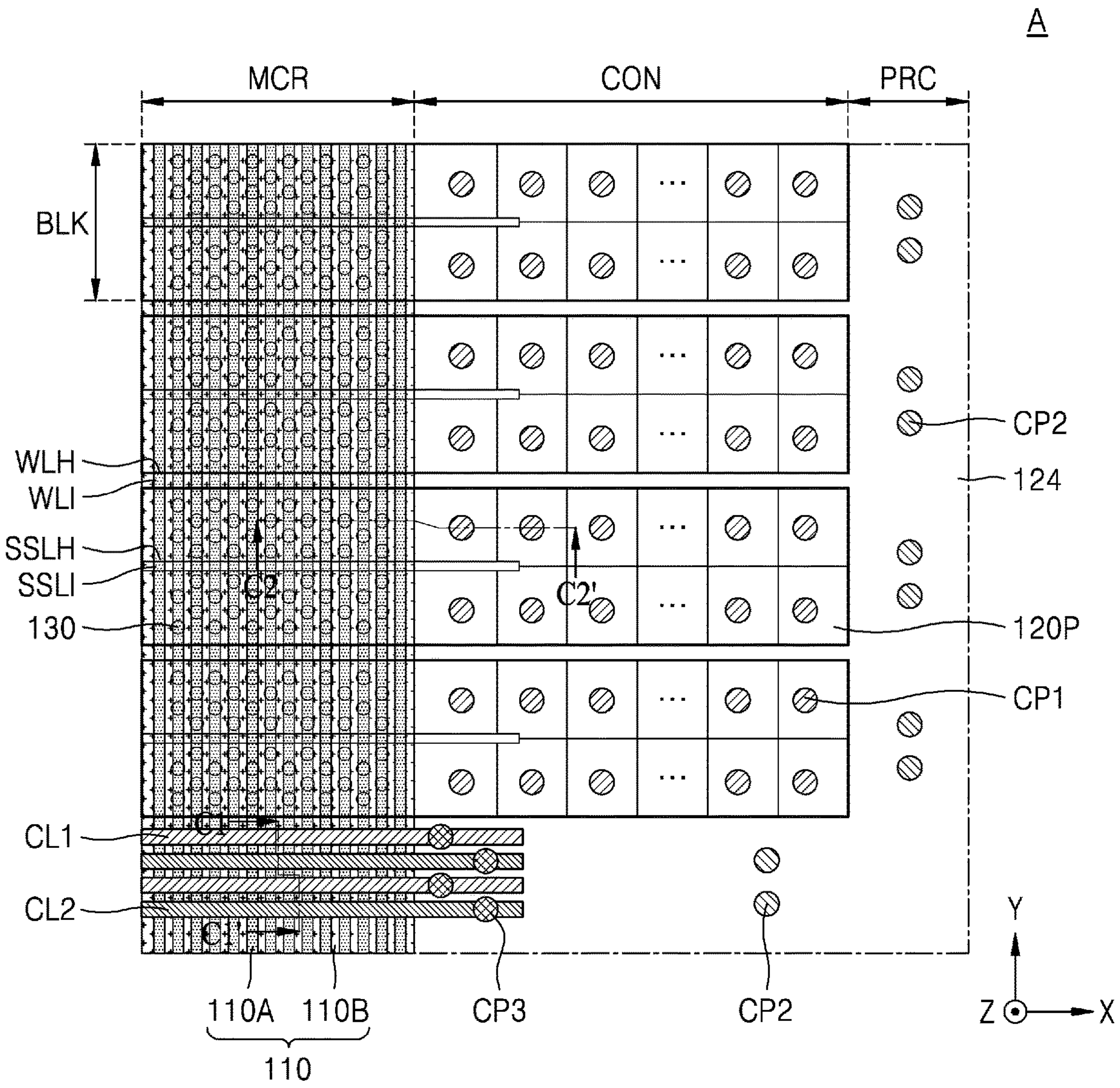
FIG. 7 is an enlarged layout view of region A of FIG. 4.
Figure 8A:
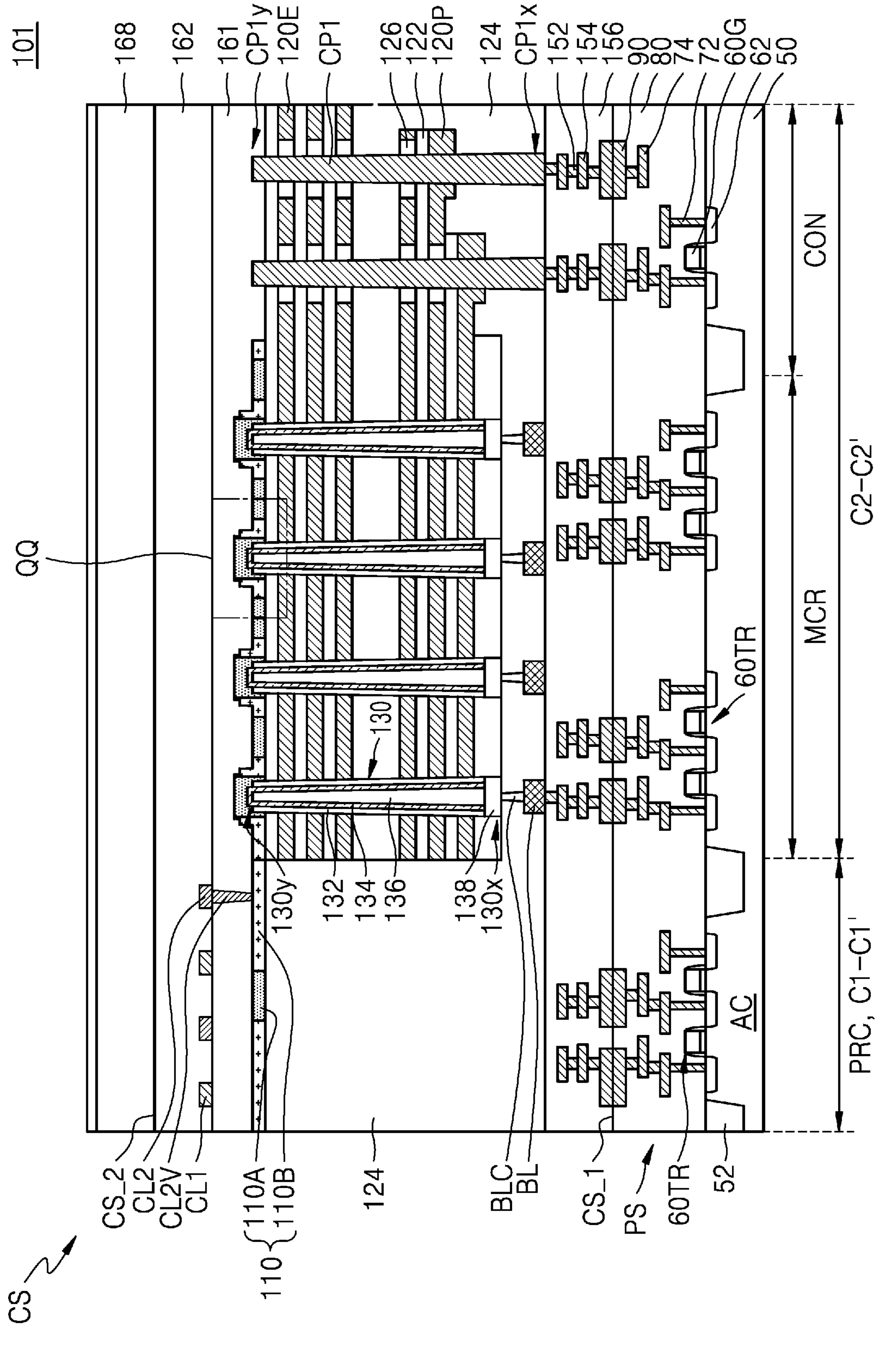
FIG. 8A is a cross-sectional view taken along lines C1-C1' and C2-C2' of FIG. 7.
Figure 8B:
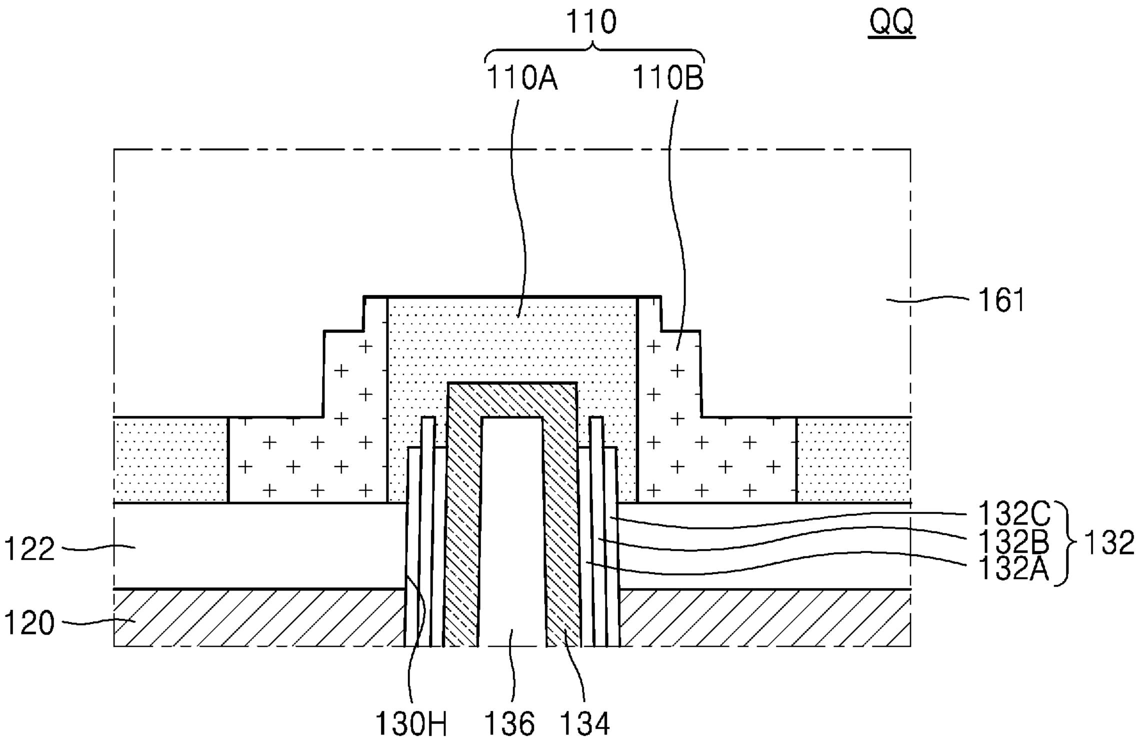
FIG. 8B is an enlarged view of region QQ of FIG. 8A.

FIG. 7 is an enlarged layout view of region A of FIG. 4. FIG. 8A is a cross-sectional view taken along lines C1-C1' and C2-C2' of FIG. 7. FIG. 8B is an enlarged view of region QQ of FIG. 8A. Hereinafter, differences from the above descriptions are described.

Referring to FIGS. 7, 8A, and 8B, a first region 110A of a common source layer 110 of a semiconductor device 101 may be in contact with a channel layer 134 of a channel structure 130, and a second region 110B may be spaced apart from the channel layer 134. The width of the first region 110A in the first horizontal direction X may be less than the width of a first end 130*x* of the channel structure 130 and greater than the width of the second end 130*y* of the channel structure 130. The first region 110A may cover or may not cover the sidewall and upper surface of a gate insulating layer 132 at the second end 130*y* of the channel structure 130. The second region 110B may cover or may not cover the sidewall and upper surface of the gate insulating layer 132 at the second end 130*y* of the channel structure 130.

FIG. 9 is an enlarged layout view of region A of FIG. 4. Hereinafter differences from the above descriptions are described. In FIG. 9, a first region 110A and a second region 110B of a common source layer 110 of a semiconductor device 102 may extend in a first horizontal direction X. The two first regions 110A may be adjacent to each other in a second horizontal direction Y with at least one second region 110B therebetween. The two second regions 110B may be adjacent to each other in the second horizontal direction Y with at least one first region 110A therebetween.

In FIG. 9, the common source layer 110 is located only in a cell region MCR, but some implementations are not limited thereto. For example, the common source layer 110 may further extend in the second horizontal direction Y and may be located in a peripheral circuit connection region PRC.

In the semiconductor device 102, according to some implementations, a first conductive line CL1 and a second conductive line CL2 may extend in the second horizontal direction Y in the cell region MCR and may extend to the peripheral circuit connection region PRC. The area occupied by the first conductive line CL1 and the second conductive line CL2 may be small in a plan view, compared to when the first conductive line CL1 and the second conductive line CL2 extend in the first horizontal direction X. Accordingly, the degree of integration of the semiconductor device 102 may be improved.

In FIG. 9, in the cell region MCR, the first conductive line CL1 and the second conductive line CL2 may extend in the second horizontal direction Y. The first conductive line CL1 and the second conductive line CL2 may extend further to the peripheral circuit connection region PRC. FIGS. 10A to 15C are schematic views showing an exemplary method of manufacturing a semiconductor device according to some implementations. Specifically, FIGS. 10A, 11A, 12A, 13A, 14, and 15A are cross-sectional views taken along lines B1-B1' and B2-B2' of FIG. 5, FIGS. 10B, 11B, 12B, 13B, and 15B are cross-sectional views taken along line B3-B3' of FIG. 5, and FIGS. 10C, 11C, 12C, 13C, and 15C are cross-sectional views taken along line B4-B4' of FIG. 5.

Figure 10A:
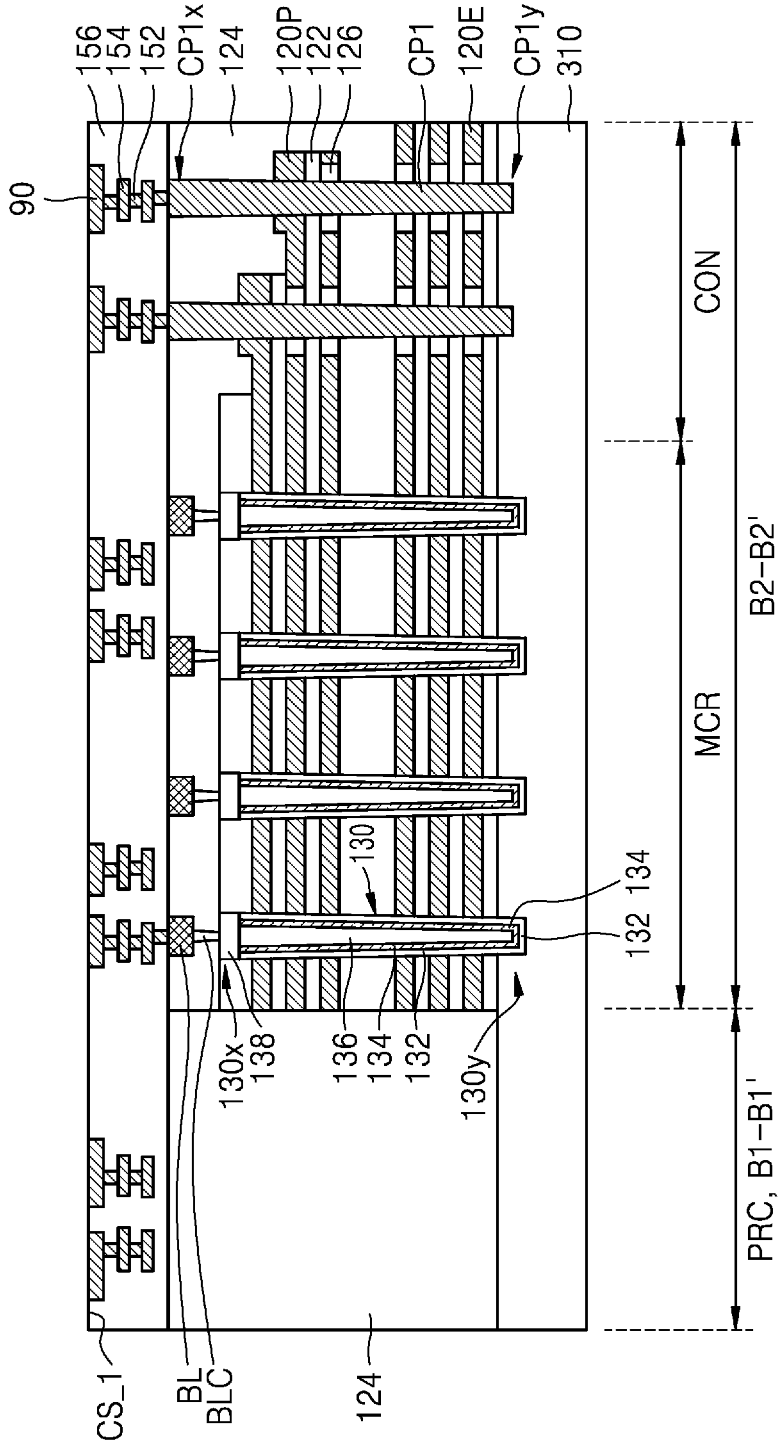
FIGS. 10A to 15C are schematic views showing an exemplary method of manufacturing a semiconductor device according to some implementations.
Figure 10B:
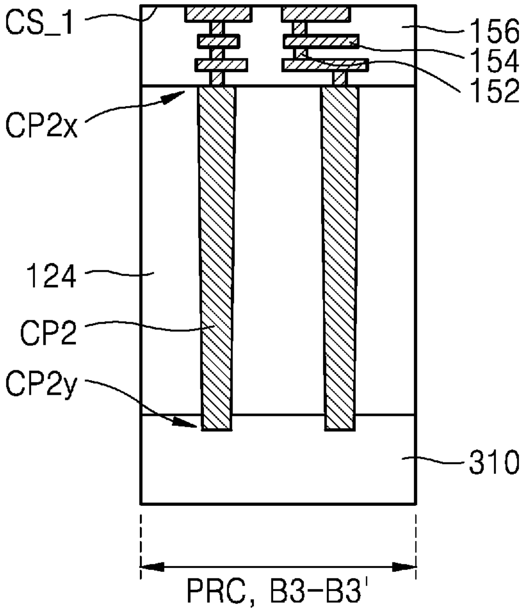
Figure 10C:
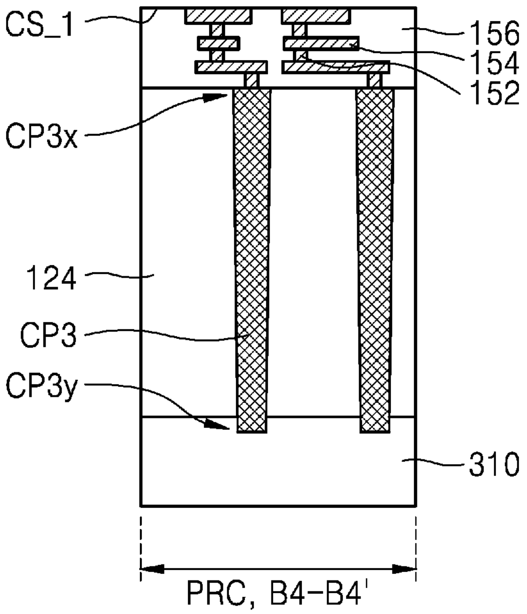

Referring to FIGS. 10A, 10B, and 10C, a carrier substrate 310 may be provided, which includes a cell region MCR, a connection region CON, and a peripheral circuit connection region PRC. The connection region CON may be spaced apart from the cell region MCR in a first horizontal direction X, and the peripheral circuit connection region PRC may surround the cell region MCR and the connection region CON. In some implementations, the carrier substrate 310 may include at least one of silicon (Si), germanium (Ge), silicon germanium (SiGe), gallium arsenide (GaAs), indium gallium arsenide (InGaAs), aluminum gallium arsenide (AlGaAs), and a mixture thereof.

Gate electrodes 120 and mold insulating layers 122 may be formed in the cell region MCR and the connection region CON on the carrier substrate 310, and extension portions 120E and pad portions 120P connected to the gate electrodes 120 may be formed in the connection region CON. A channel structure 130 passing through the gate electrodes 120 and extending in a vertical direction Z and a bit line BL connected to the channel structure 130 may be formed in the cell region MCR. A stack insulating layer 124 surrounding the gate electrodes 120, the extension portions 120E, and the pad portions 120P may be formed in the connection region CON and the peripheral circuit connection region PRC. A first plug CP1 passing through the extension portions 120E and the pad portion 120P may be formed in the connection region CON, and a second plug CP2 and a third plug CP3 passing through the stack insulating layer 124 may be formed in the peripheral circuit connection region PRC.

The channel structure 130, the first plug CP1, the second plug CP2, and the third plug CP3 may further extend in the vertical direction Z and be inserted into the carrier substrate 310. A connection via 152 and a connection wiring layer 154 may be provided and electrically connected to the bit line BL, the first plug CP1, the second plug CP2, and the third plug CP3, and a second interlayer insulating film 156 may be provided.

Although not shown, a stack separation opening WLH may pass through the gate electrodes 120 and the mold insulating layers 122 and extend in the vertical direction Z, and a stack separation insulating layer WLI may be formed inside the stack separation opening WLH. The stack separation insulating layer WLI may further extend in the vertical direction Z and be inserted into the carrier substrate 310.

In some implementations, during forming the channel structure 130, a first end 130*x* of the channel structure 130 may be at a higher vertical level than the second end 130*y* of the channel structure 130, and the second end 130*y* may extend into the carrier substrate 310, as shown in FIG. 10A.

In some implementations, during forming the first plug CP1, a third end CP1x of the first plug CP1 may have a greater width than a fourth end CP1y of the first plug CP1, and the fourth end CP1y of the first plug CP1 may extend into the carrier substrate 310.

In some implementations, during forming the second plug CP2, a fifth end CP2x of the second plug CP2 may have a greater width than a sixth end CP2y of the second plug CP2, and the sixth end CP2y of the second plug CP2 may extend into the carrier substrate 310.

In some implementations, during forming the third plug CP3, a seventh end CP3x of the third plug CP3 may have a greater width than an eighth end CP3y of the third plug CP3, and the eighth end CP3y of the third plug CP3 may extend into the carrier substrate 310.

Figure 11A:
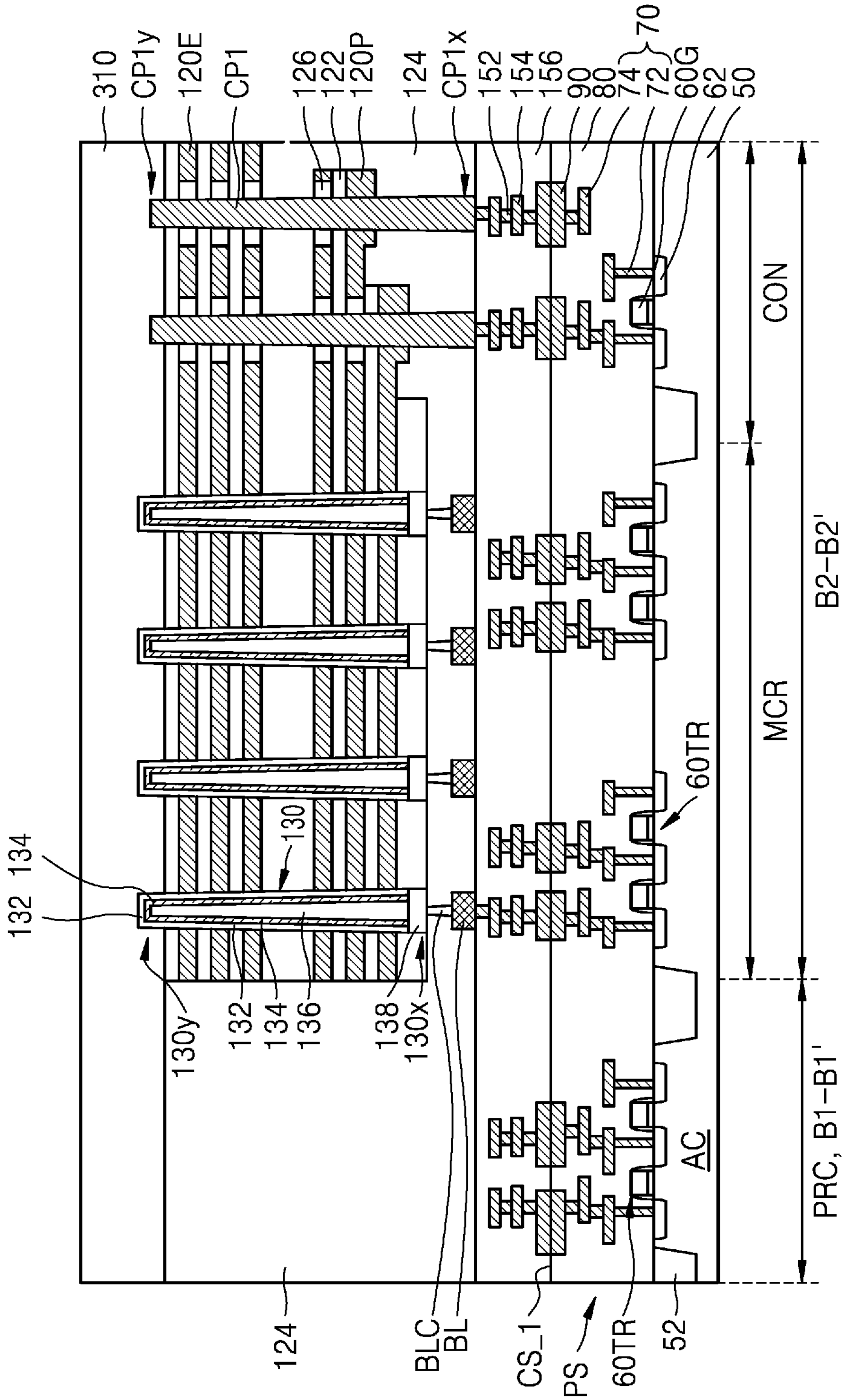
Figure 11B:
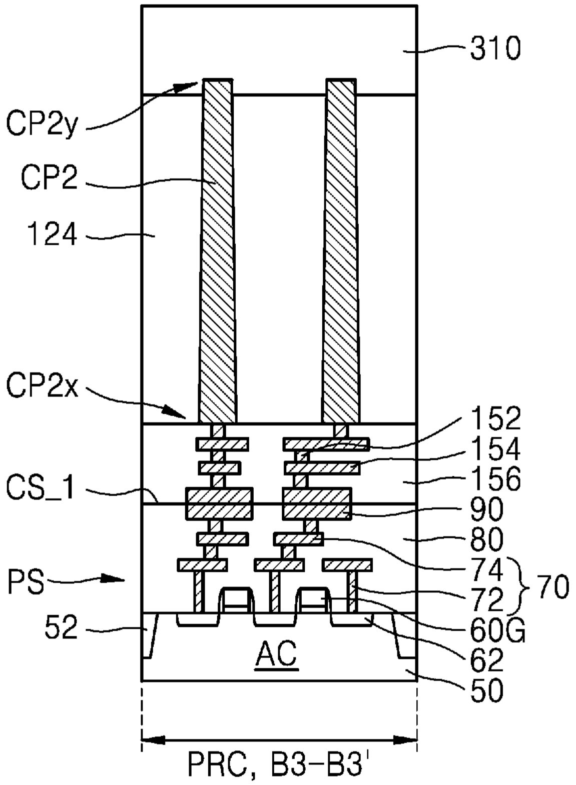
Figure 11C:
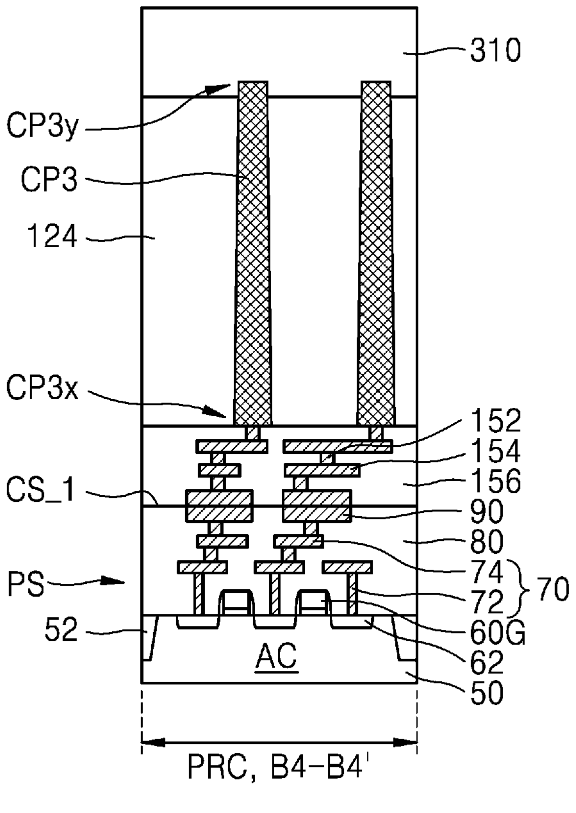

Referring to FIGS. 11A, 11B, and 11C, a peripheral circuit structure PS may be prepared. The peripheral circuit structure PS may include a peripheral circuit transistor 60TR and a peripheral circuit wiring structure 70, which are arranged on a substrate 50. An active region AC may be defined in the substrate 50 by an element isolation film 52, and a plurality of peripheral circuit transistors 60TR may be formed on the active region AC. The plurality of peripheral circuit transistors 60TR may each include a peripheral circuit gate 60G and source/drain regions 62 arranged in portions of the substrate 50 on both sides of the peripheral circuit gate 60G.

Subsequently, the peripheral circuit structure PS may be attached to the cell structure CS. The peripheral circuit structure PS and the cell structure CS may be attached to each other, using a metal-oxide hybrid bonding method, through a connection pad 90, a first interlayer insulating film 80, and the second interlayer insulating film 156.

Subsequently, the structure in which the peripheral circuit structure PS and the cell structure CS are attached to each other may be turned over so that the carrier substrate 310 is oriented upward.

Figure 12A:
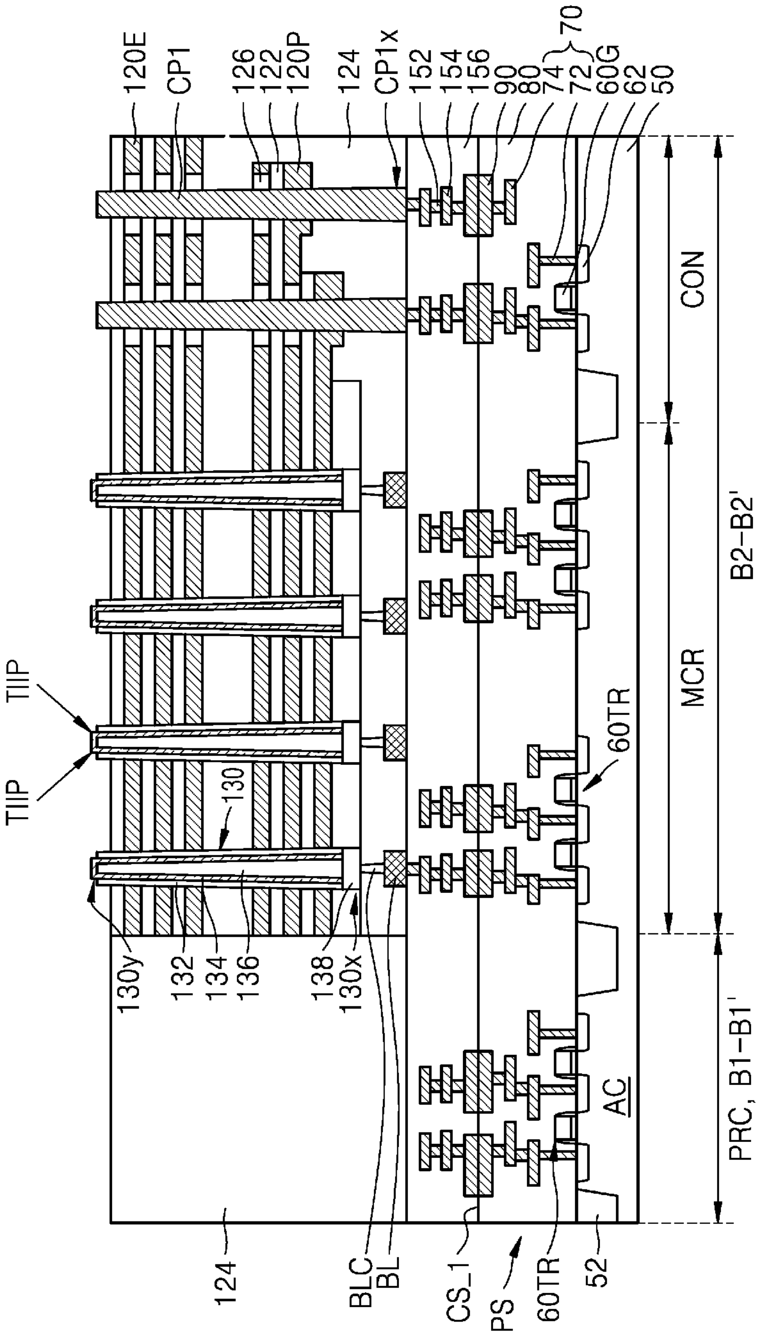
Figure 12B:
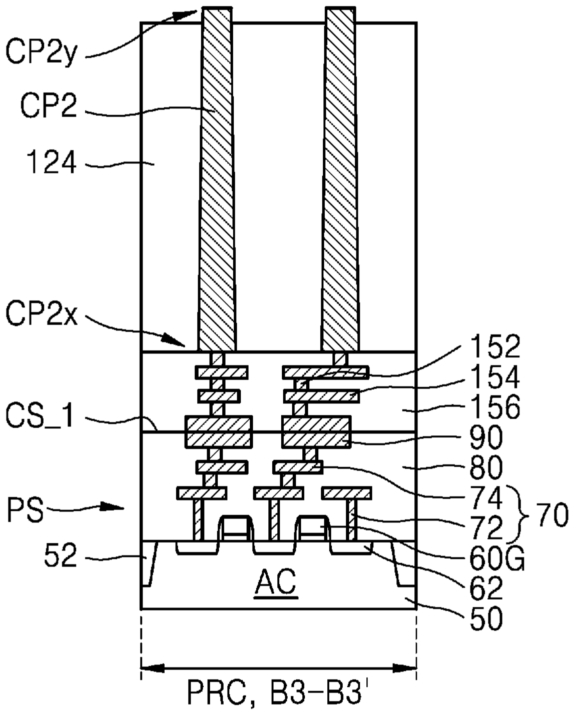
Figure 12C:
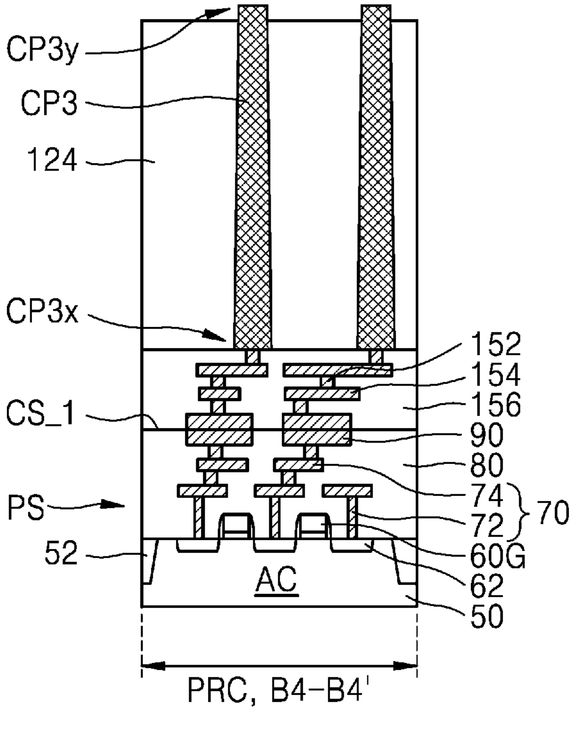

Referring to FIGS. 12A, 12B, and 12C, the carrier substrate 310 may be removed (in FIG. 12A). The carrier substrate 310 may be removed by a grinding process and a subsequent etching process, and the second end 130*y* of the channel structure 130 may be exposed. Similarly, as the carrier substrate 310 is removed, the fourth end CP1y of the first plug CP1, the sixth end CP2y of the second plug CP2, and the eighth end CP3y of the third plug CP3 may be exposed. Although not shown, as the carrier substrate 310 is removed, the upper portion of the stack separation insulating layer WLI may also be exposed.

Subsequently, a portion of a gate insulating layer 132 exposed at the second end 130*y* of the channel structure 130 may be removed, and the upper surface of a channel layer 134 may be exposed. In some implementations, the upper surface of the gate insulating layer 132 may be at a lower level than the upper surface of the channel layer 134, and an upper portion of the gate insulating layer 132 may be further removed to partially expose the upper surface and sidewall of the channel layer 134.

Subsequently, a tilt ion implantation process TIIP may be performed on the channel layer 134. In the tilt ion implantation process TIIP, the ion implantation process is performed at an angle inclined relative to the vertical direction Z. In the tilt ion implantation process TIIP, first conductivity-type impurities may be implanted into the channel layer 134, in which the first conductivity type may include P type.

Figure 13A:
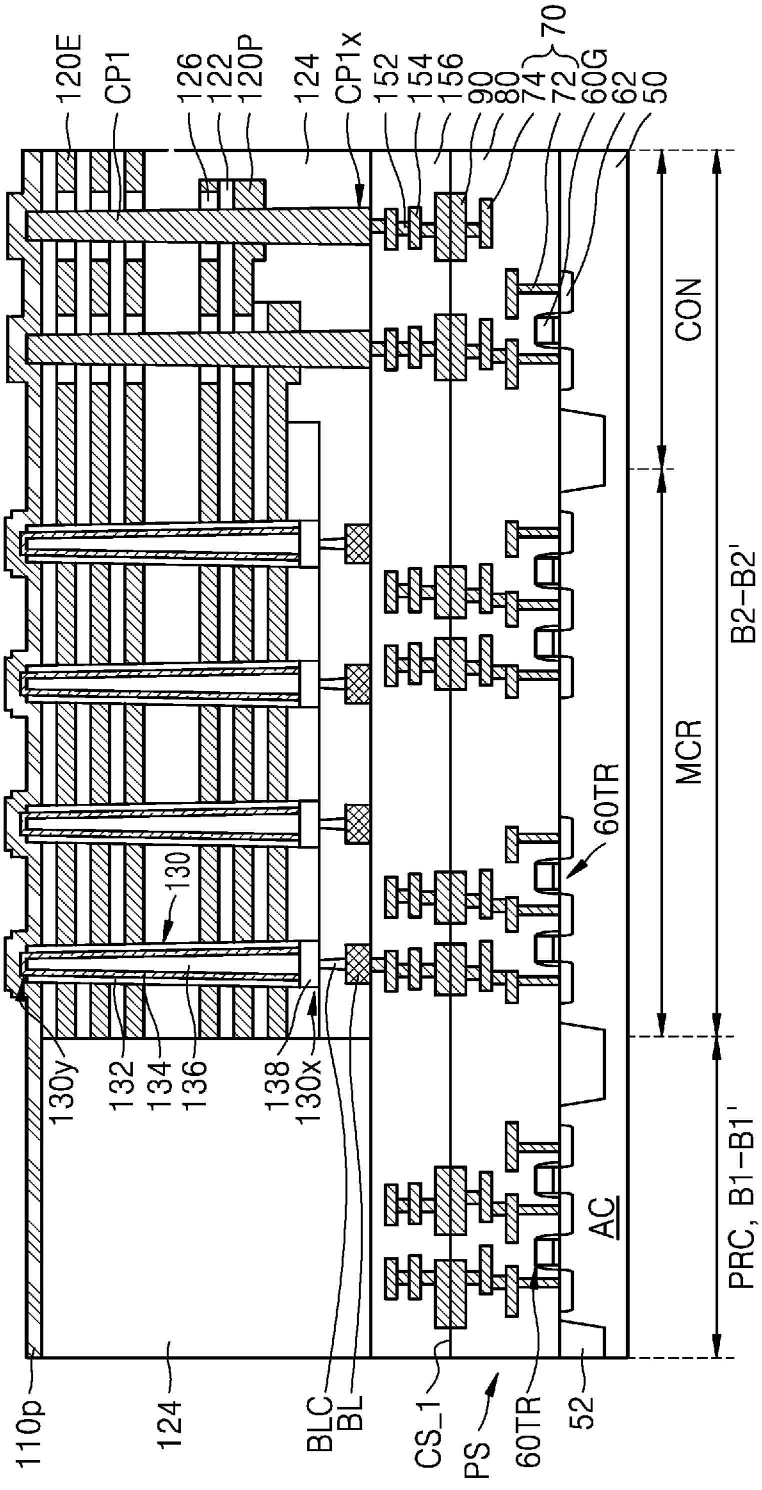
Figure 13B:
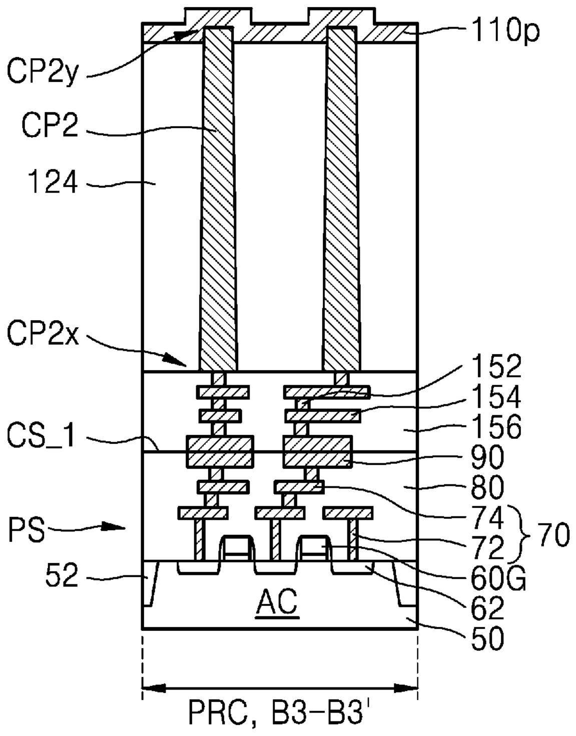
Figure 13C:
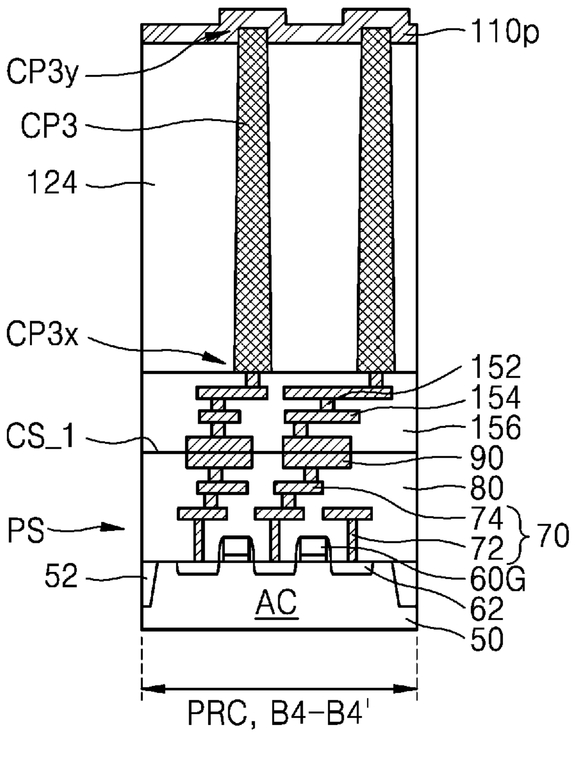

Referring to FIGS. 13A, 13B, and 13C, a preliminary common source layer 110*p* may be formed on the cell region MCR, the connection region CON, and the peripheral circuit connection region PRC. The preliminary common source layer 110*p* may be formed using polysilicon.

In the cell region MCR, the preliminary common source layer 110*p* may be conformally formed on the uppermost mold insulating layer among the mold insulating layers 122 and the exposed upper surfaces of the channel layer 134. In the connection region CON and the peripheral circuit connection region PRC, the preliminary common source layer 110*p* may be formed on the stack insulating layer 124, the first plug CP1, the second plug CP2, and the third plug CP3.

Figure 14:
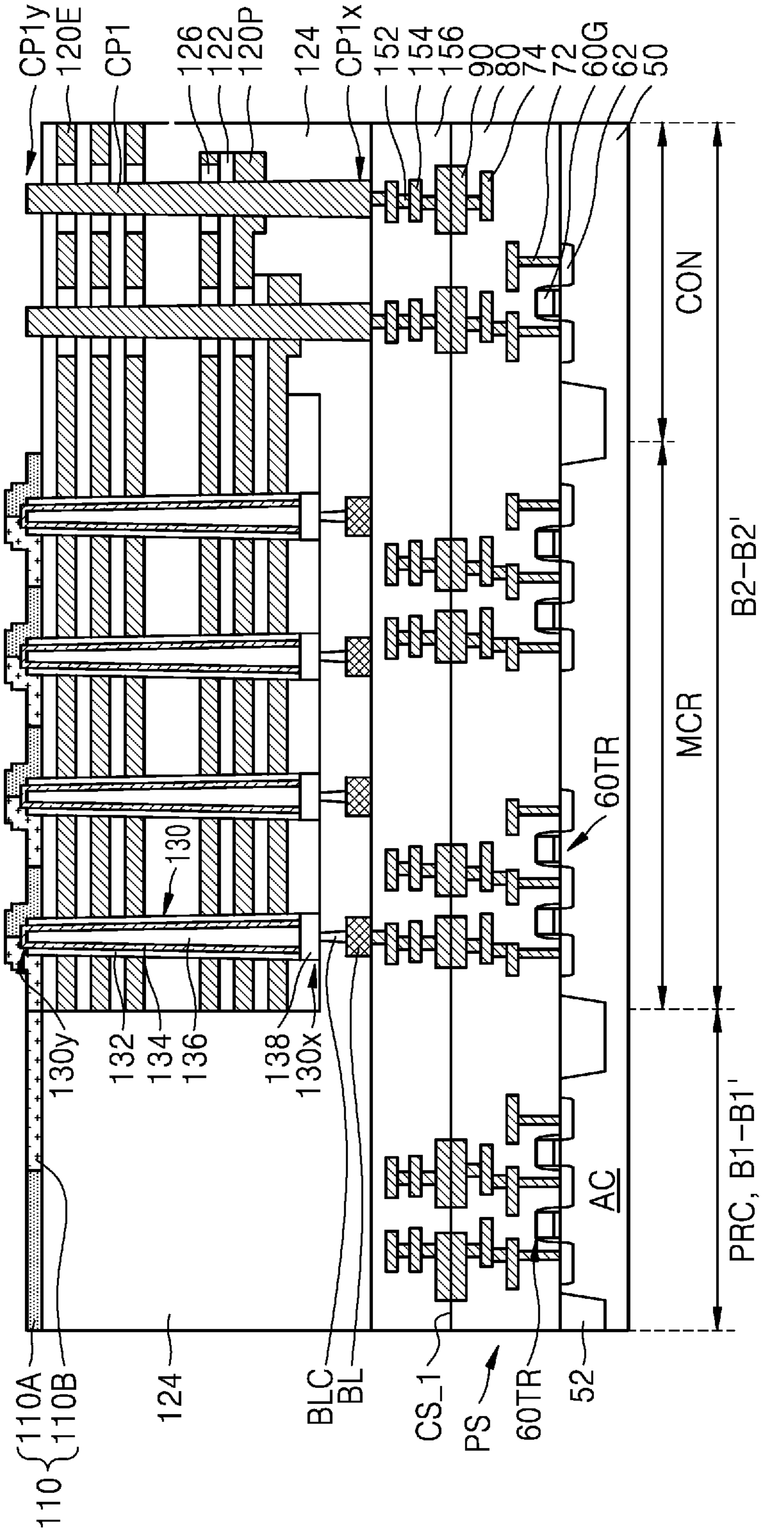

Referring to FIG. 14, a first ion implantation process and a second ion implantation process may be performed on the preliminary common source layer 110*p* using a first photo mask film and a second photo mask film, respectively. In the first ion implantation process, portions of the preliminary common source layer 110*p*, in which second regions 110B are to be formed, may covered with the first photo mask film, and first conductivity-type impurities may be implanted into the preliminary common source layer 110*p*. After completing the first ion implantation process, the second ion implantation process may be performed. In the second ion implantation process, portions of the preliminary common source layer 110*p*, in which first regions 110A are to be formed, may covered with the second photo mask film, and second conductivity-type impurities may be implanted into the preliminary common source layer 110*p*. In some implementations, the order of the first ion implantation process and the second ion implantation process may be changed. Subsequently, the preliminary common source layer 110*p* disposed on the connection region CON and the peripheral circuit connection region PRC may be removed. Accordingly, the common source layer 110 including the first region 110A and the second region 110B may be formed on the cell region MCR.

Subsequently, a laser annealing may be performed on the common source layer 110. In some implementations, the laser annealing may be performed to improve the degree of crystallinity of the common source layer 110 in the cell region MCR, increase the grain size of the common source layer 110, or reduce the resistance of the common source layer 110. In some implementations, the laser annealing may be performed on the preliminary common source layer 110*p* before performing the first ion implantation process and the second ion implantation process.

Figure 15A:
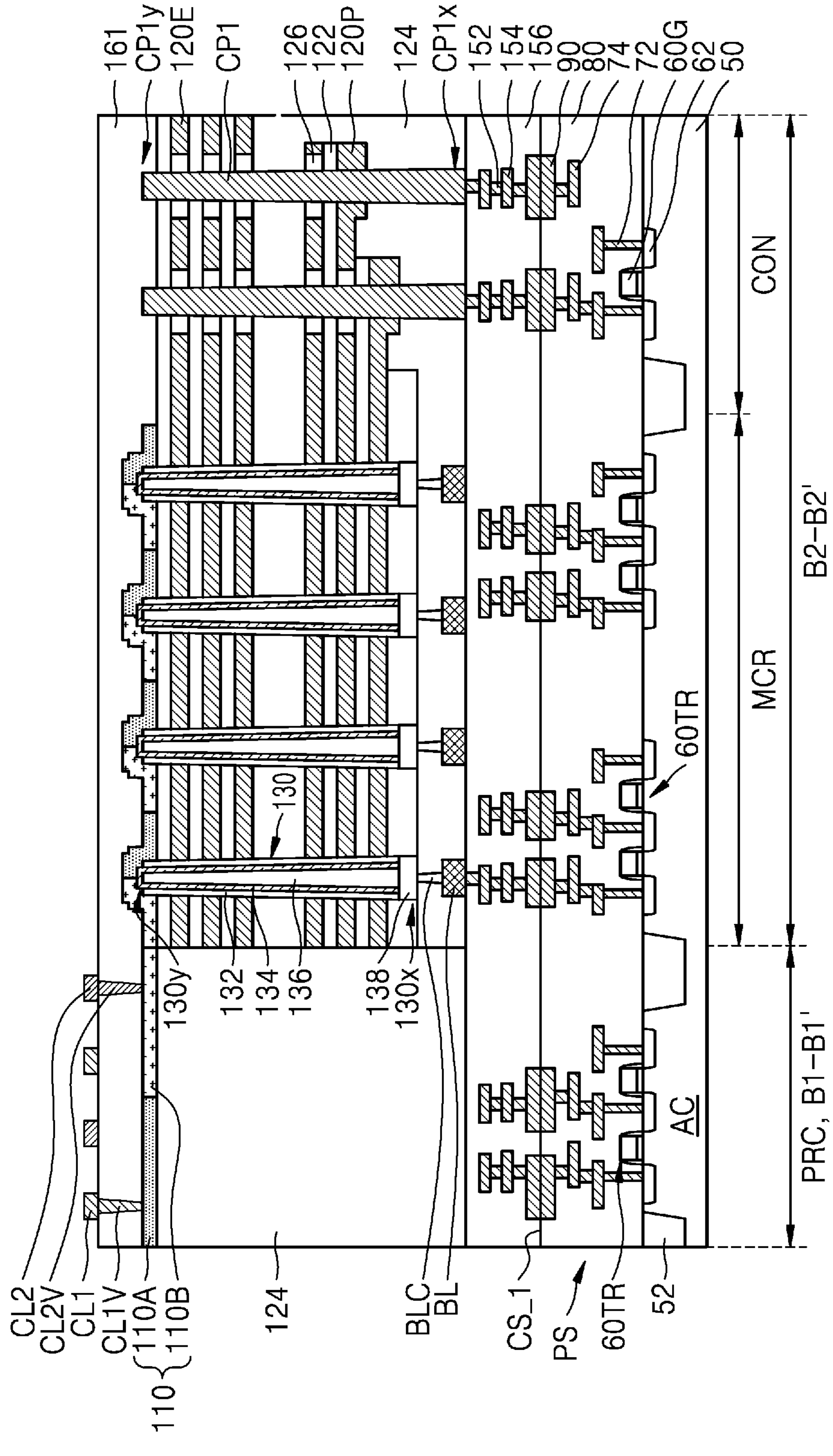
Figure 15B:
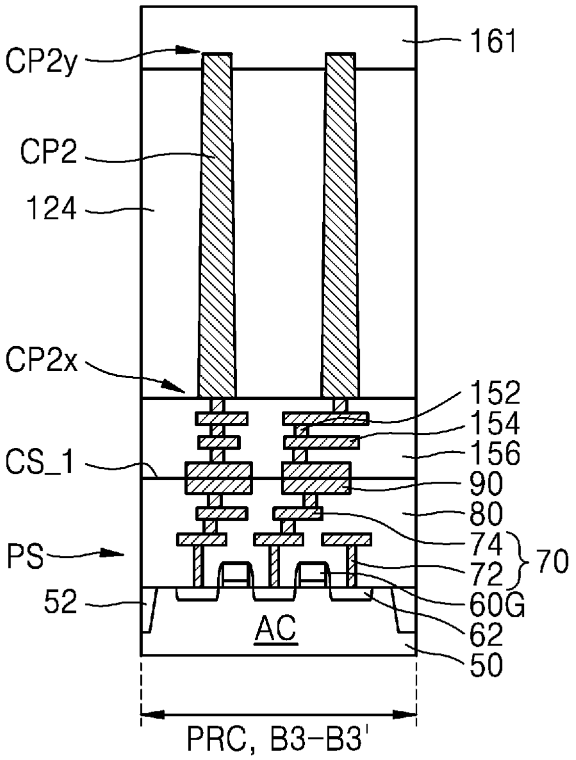
Figure 15C:
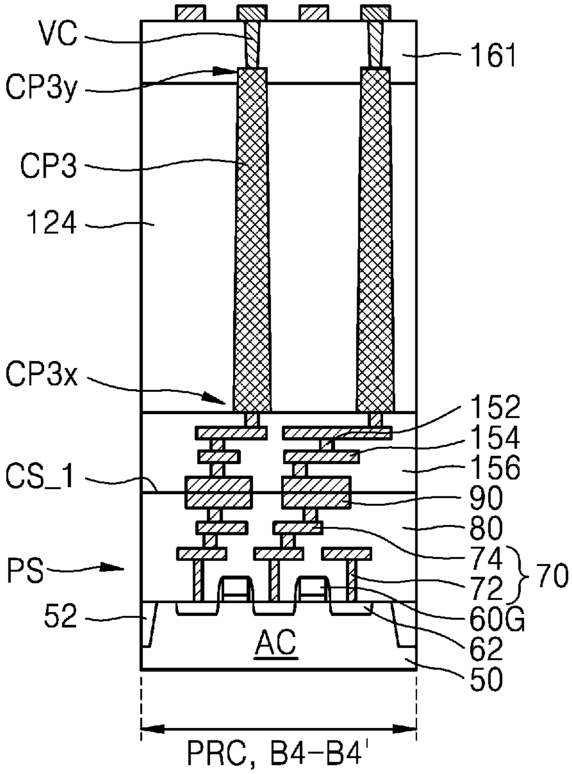

Referring to FIGS. 15A, 15B, and 15C, a first upper interlayer insulating film 161 may cover the common source layer 110. The first upper interlayer insulating film 161 may cover the uppermost mold insulating layer among the mold insulating layers 122 and the fourth end CP1y of the first plug CP1 in the connection region CON. The first upper interlayer insulating film 161 may cover the stack insulating layer 124, the sixth end CP2y of the second plug CP2, and the eighth end CP3y of the third plug CP3 in the peripheral circuit connection region PRC.

Subsequently, a third conductive via VC may pass through the first upper interlayer insulating film 161 and be connected to the third plug CP3. Then, the first conductive line CL1 and the second conductive line CL2 may be formed on the first upper interlayer insulating film 161. The first conductive line CL1 and the second conductive line CL2 may extend in the first horizontal direction X in the peripheral circuit connection region PRC.

Referring back to FIGS. 5, 6A, 6B, and 6C, the second upper interlayer insulating film 162 may be formed on the first upper interlayer insulating film 161. The second upper interlayer insulating film 162 may cover the first conductive line CL1 and the second conductive line CL2. Subsequently, back-side vias 164 may pass through the second upper interlayer insulating film 162, in which each of the back-side vias 164 may be connected to the second plug CP2.

Back-side pads 166 connected to the back-side vias 164 may be formed on the second upper interlayer insulating film 162. Subsequently, a passivation layer 168 covering the back-side pads 166 is formed on the second upper interlayer insulating film 162, and an opening OP may be formed in the passivation layer 168 and expose the upper surfaces of the back-side pads 166.

Figure 16:
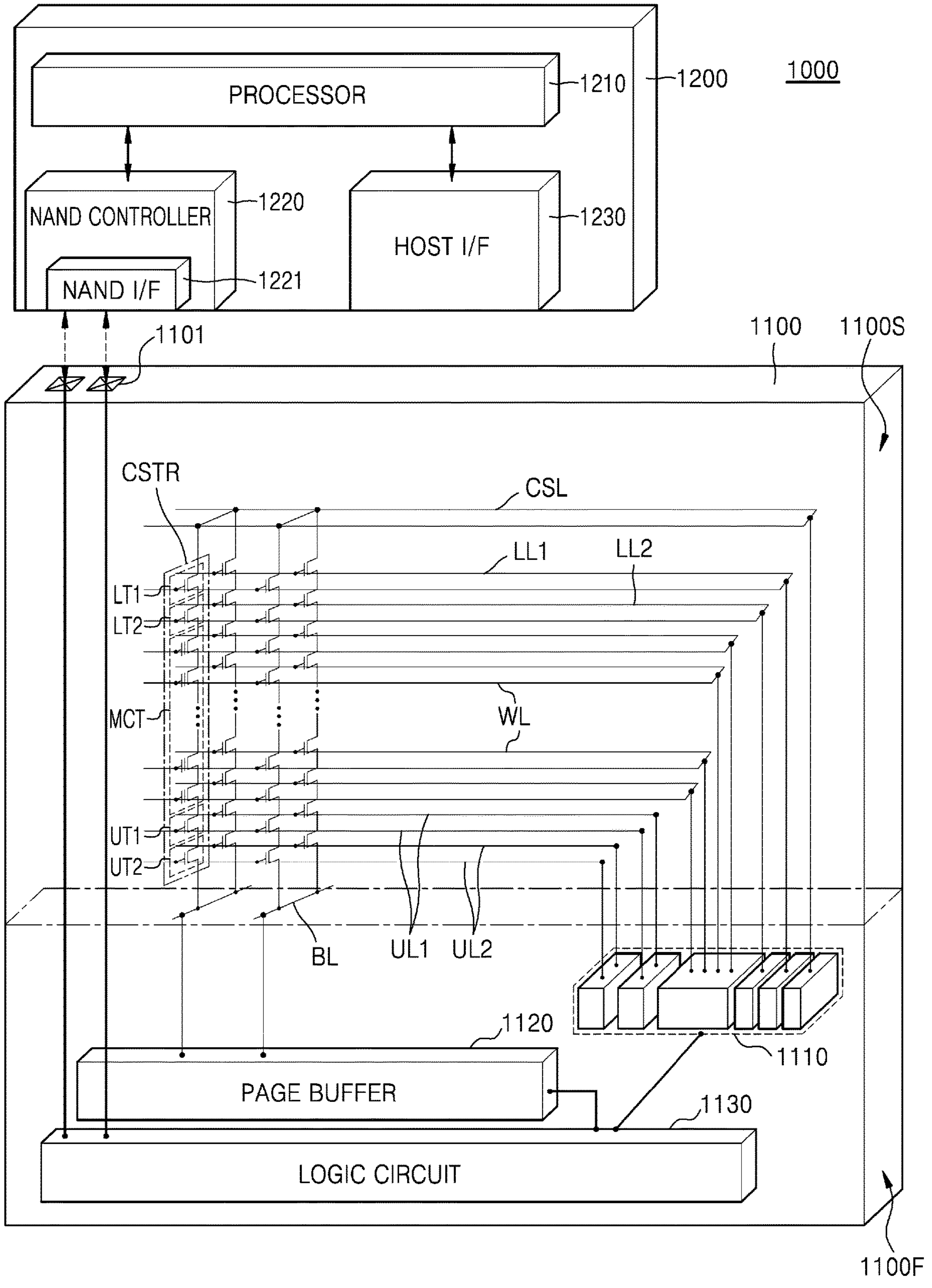
FIG. 16 is a schematic diagram showing an exemplary data storage system including the semiconductor device according to some implementations.

FIG. 16 is a schematic diagram showing an exemplary data storage system according to some implementations. In FIG. 16, a data storage system 1000 may include one or more semiconductor devices 1100 and a memory controller 1200 electrically connected to the semiconductor devices 1100. The data storage system 1000 may include, for example, a solid state drive (SSD) device, a universal serial bus (USB), a computing system, a medical device, or a communication device, which includes at least one semiconductor device 1100.

In some implementations, the semiconductor device 1100 may include a non-volatile semiconductor device. For example, the semiconductor device 1100 may include a NAND flash semiconductor device including one of the semiconductor devices 10, 100, 101, and 102, as described with reference to FIGS. 1-9. The semiconductor device 1100 may include a first structure 1100F and a second structure 1100S on the first structure 1100F. The first structure 1100F may include the peripheral circuit structure PS (in FIG. 3) that includes a row decoder 1110, a page buffer 1120, and a logic circuit 1130.

The second structure 1100S may include the memory cell structure CS (in FIG. 3) that includes a bit line BL, a common source line CSL, a plurality of word lines WL, first and second string selection lines UL1 and UL2, first and second ground selection lines LL1 and LL2, and a plurality of memory cell strings CSTR between the bit line BL and the common source line CSL. In the second structure 1100S, each of the plurality of memory cell strings CSTR may include ground selection transistors LT1 and LT2 adjacent to the common source line CSL, string selection transistors UT1 and UT2 adjacent to the bit line BL, and a plurality of memory cell transistors MCT arranged between the ground selection transistors LT1 and LT2 and the string selection transistors UT1 and UT2. The number of ground selection transistors LT1 and LT2 and the number of string selection transistors UT1 and UT2 can vary.

In some implementations, the plurality of ground selection lines LL1 and LL2 may be connected to gate electrodes of the ground selection transistors LT1 and LT2, respectively. The word lines WL may be connected to gate electrodes of the memory cell transistors MCT. The plurality of string selection lines UL1 and UL2 may be connected to gate electrodes of the string selection transistors UT1 and UT2, respectively.

The common source line CSL, the plurality of ground selection lines LL1 and LL2, the plurality of word lines WL, and the plurality of string selection lines UL1 and UL2 may be connected to the row decoder 1110. A plurality of bit lines BL may be electrically connected to the page buffer 1120.

The semiconductor device 1100 may communicate with the memory controller 1200 via the input/output pad 1101 electrically connected to the logic circuit 1130. The input/output pad 1101 may be electrically connected to the logic circuit 1130.

The memory controller 1200 may include a processor 1210, a NAND controller 1220, and a host interface 1230. In some implementations, the data storage system 1000 may include a plurality of semiconductor devices 1100, in which the memory controller 1200 may be configured to control the plurality of semiconductor devices 1100.

The processor 1210 may be configured to control the overall operation of the data storage system 1000 including the memory controller 1200. The processor 1210 may be configured to operate according to certain firmware and may access the semiconductor device 1100 by controlling the NAND controller 1220. The NAND controller 1220 may include a NAND interface 1221 that is configured to process communications with the semiconductor device 1100. A control command may be configured to control the semiconductor device 1100, control data to be written to the plurality of memory cell transistors MCT of the semiconductor device 1100, in which the data to be read from the plurality of memory cell transistors MCT of the semiconductor device 1100 may be transmitted via the NAND interface 1221. The host interface 1230 may be configured to provide a communication function between the data storage system 1000 and an external host. When a control command is received from the external host via the host interface 1230, the processor 1210 may control the semiconductor device 1100 in response to the control command.

Figure 17:
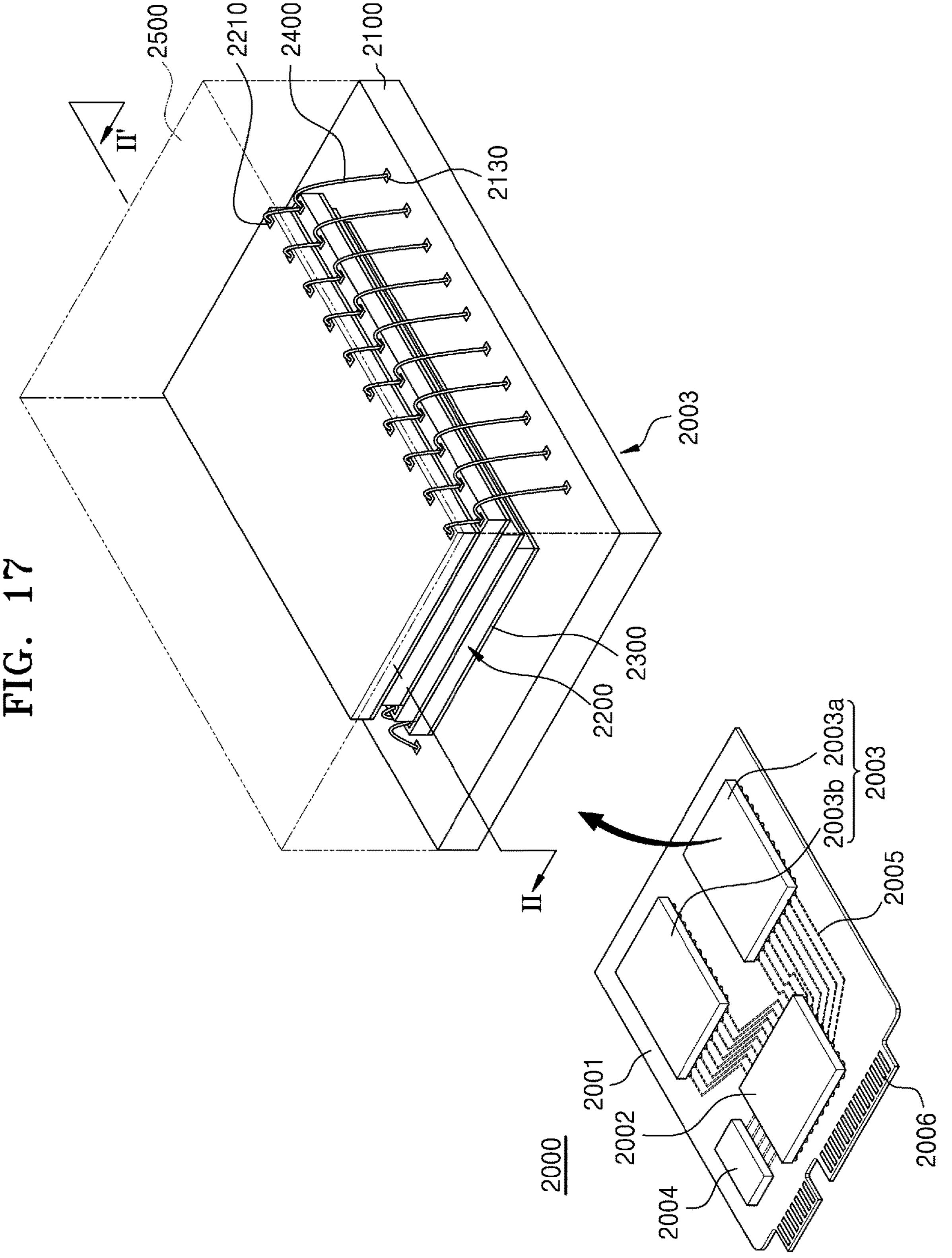
FIG. 17 is a perspective view showing an exemplary data storage system according to some implementations.

FIG. 17 is a perspective view showing and exemplary data storage system 2000 according to some implementations. In FIG. 17, the data storage system 2000 may include a main board 2001, a memory controller 2002 mounted on the main board 2001, one or more semiconductor packages 2003, and random-access memory (DRAM) 2004. The semiconductor package 2003 and the DRAM 2004 may be connected to the memory controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary depending on the communication interface between the data storage system 2000 and the external host. In some implementations, the data storage system 2000 may be configured to communicate with an external host according to one of interfaces, such as universal serial bus (USB), peripheral component interconnect express (PCI-Express), serial advanced technology attachment (SATA), and M-Phy for universal flash storage (UFS). In some implementations, the data storage system 2000 may be operated by power supplied from the external host via the connector 2006. The data storage system 2000 may further include a power management integrated circuit (PMIC) configured to distribute the power supplied from the external host to the memory controller 2002 and the semiconductor package 2003.

The memory controller 2002 may be configured to write data to the semiconductor package 2003 or read data from the semiconductor package 2003. Accordingly, the memory controller 2002 may improve the operating speed of the data storage system 2000.

The DRAM 2004 may include a buffer memory configured for alleviating a difference in speeds between the external host and the semiconductor package 2003 that includes a data storage space. The DRAM 2004 included in the data storage system 2000 may be configured to operate as a cache memory and may provide a space for temporarily storing data during the operation of controlling the semiconductor package 2003. When the data storage system 2000 includes the DRAM 2004, the memory controller 2002 may further include a DRAM controller configured to control the DRAM 2004 in addition to a NAND controller configured to control the semiconductor package 2003.

The semiconductor package 2003 may include first and second semiconductor packages **2003*a* and 2003*b* spaced apart from each other. The first and second semiconductor packages 2003*a* and 2003*b* may each include a plurality of semiconductor chips 2200. Each of the first and second semiconductor packages 2003*a* and 2003*b* may include a package board 2100, a plurality of semiconductor chips 2200 on the package board 2100, an adhesive layer 2300 disposed on the lower surface of each of the plurality of semiconductor chips 2200, a connection structure 2400 electrically connecting the plurality of semiconductor chips 2200 to the package board 2100, and a molding layer 2500 covering the plurality of semiconductor chips 2200 and the connection structure 2400 on the package board 2100**.

The package board 2100 may include a printed circuit board having a plurality of package upper pads 2130. Each of the plurality of semiconductor chips 2200 may include an input/output pad 2210. The input/output pad 2210 may correspond to the input/output pad 1101 (in FIG. 16). Each of the plurality of semiconductor chips 2200 may include at least one of the semiconductor devices 10, 100, 101, and 102 described with reference to FIGS. 1-9.

In some implementations, the connection structure 2400 may include bonding wires electrically connecting input/output pads 2210 to the package upper pads 2130. Accordingly, in the first and second semiconductor packages **2003*a* and 2003*b*, the plurality of semiconductor chips 2200 may be electrically connected to each other using a bonding wire and may be electrically connected to the package upper pads 2130 of the package board 2100. In some implementations, in the first and second semiconductor packages 2003*a* and 2003*b*, the plurality of semiconductor chips 2200 may be electrically connected to each other by a connection structure including a through silicon via (TSV), instead of using the connection structure 2400** of the bonding wire type.

In some implementations, the memory controller 2002 and the plurality of semiconductor chips 2200 may be included in a single package. In some implementations, the memory controller 2002 and the plurality of semiconductor chips 2200 may be mounted on a separate interposer board that is different from the main board 2001, and the memory controller 2002 and the plurality of semiconductor chips 2200 may be connected to each other by wiring formed on the interposer board.

Figure 18:
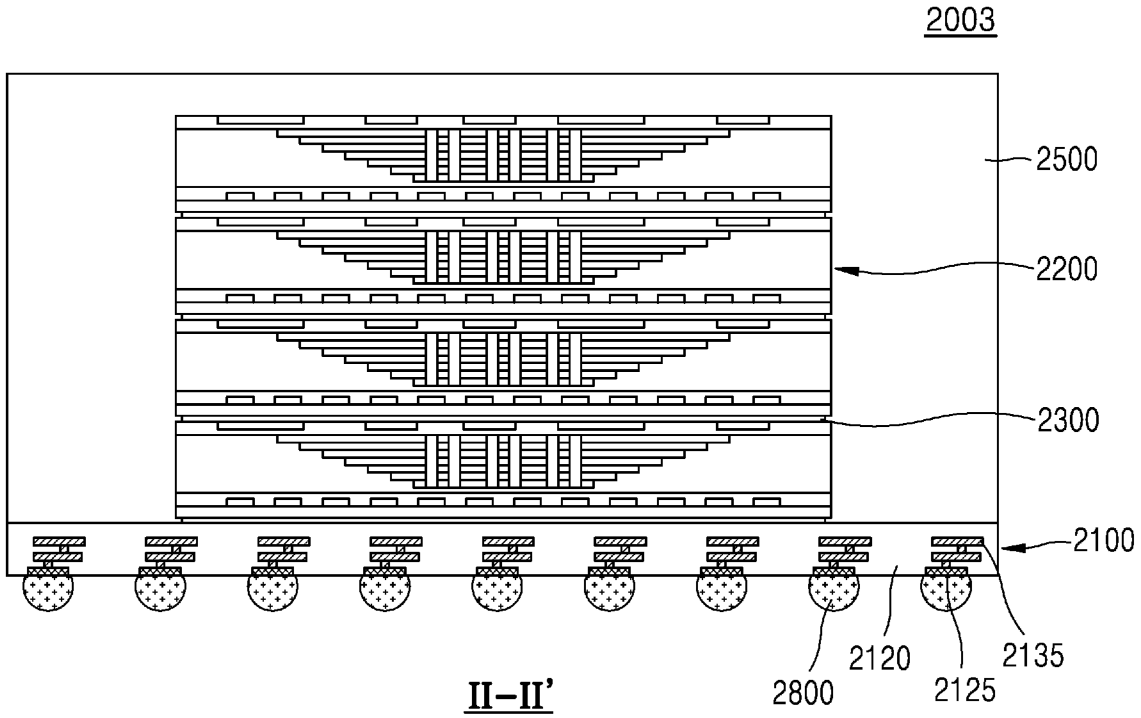
FIG. 18 is a cross-sectional view taken along line II-II' of FIG. 17 showing an exemplary semiconductor package according to some implementations.

FIG. 18 is a cross-sectional view taken along line II-II' of FIG. 17 showing an exemplary semiconductor package according to some implementations. In FIG. 18, in semiconductor package 2003, the package board 2100 may include a printed circuit board. The package board 2100 may include a package substrate body 2120, the plurality of package upper pads 2130 (in FIG. 17) arranged on the upper surface of the package substrate body 2120, a plurality of lower pads 2125 arranged on or exposed through the lower surface of the package substrate body 2120, and a plurality of internal wirings 2135 electrically connecting the plurality of package upper pads 2130 (in FIG. 17) and the plurality of lower pads 2125 to each other inside the package substrate body 2120. In FIG. 17, the plurality of package upper pads 2130 may be electrically connected to a plurality of respective connection structures 2400. As shown in FIG. 18, the plurality of lower pads 2125 may be respectively connected to the plurality of wiring patterns 2005 on the main board 2001 of the data storage system 2000, as shown in FIG. 17, via the plurality of conductive bumps 2800. Each of the plurality of semiconductor chips 2200 may include at least one of the semiconductor devices 10, 100, 101, and 102 described with reference to FIGS. 1-9.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

What is claimed is:

1. A semiconductor device comprising:

a peripheral circuit structure; and a cell structure stacked on the peripheral circuit structure, the cell structure comprising a cell region, a connection region located next to the cell region in a first horizontal direction, and a peripheral circuit connection region surrounding the cell region and the connection region, wherein the cell structure comprises:

a plurality of gate electrodes, each of the gate electrodes being arranged in the cell region and spaced apart from each other in a vertical direction;

a channel structure passing through the gate electrodes in the cell region and extending in the vertical direction, the channel structure having a first end close to the peripheral circuit structure and a second end opposite to the first end; and a common source layer disposed above the plurality of gate electrodes and covering the second end of the channel structure, wherein the channel structure comprises a channel layer extending in the vertical direction, wherein the common source layer comprises a first region and a second region that contain impurities of different conductivity types, and wherein the first region of the common source layer is connected to at least a portion of the channel layer.

2. The semiconductor device of claim 1, wherein the first region of the common source layer comprises a P-type conductivity.

3. The semiconductor device of claim 2, wherein a first portion of the channel layer is connected to the first region of the common source layer, and wherein a second portion of the channel layer is connected to the second region of the common source layer.

4. The semiconductor device of claim 2, wherein the second region of the common source layer is spaced apart from the channel layer.

5. The semiconductor device of claim 1, wherein the cell structure further comprises:

a first conductive line electrically connected to the first region of the common source layer; and a second conductive line electrically connected to the second region of the common source layer, wherein, in the peripheral circuit connection region, the first conductive line and the second conductive line extend in the first horizontal direction.

6. The semiconductor device of claim 5, wherein the cell structure further comprises:

a stack insulating layer surrounding the plurality of gate electrodes in the connection region and the peripheral circuit connection region; and a plug passing through the stack insulating layer in the peripheral circuit connection region and connected to one of the first conductive line and the second conductive line, wherein the plug is electrically connected to the peripheral circuit structure.

7. The semiconductor device of claim 5, wherein each of the first conductive line and the second conductive line is provided in plurality, and wherein a plurality of first conductive lines and a plurality of second conductive lines are alternately arranged in at least one of the first horizontal direction or in a second horizontal direction crossing the first horizontal direction.

8. The semiconductor device of claim 1, wherein the cell structure further comprises:

a first conductive line electrically connected to the first region of the common source layer; and a second conductive line electrically connected to the second region of the common source layer, wherein the first conductive line and the second conductive line extend in a second horizontal direction crossing the first horizontal direction.

9. The semiconductor device of claim 8, wherein the cell structure further comprises:

a stack insulating layer surrounding the plurality of gate electrodes in the connection region and the peripheral circuit connection region; and a plug passing through the stack insulating layer in the peripheral circuit connection region and connected to one of the first conductive line and the second conductive line, wherein, in a plan view, the plug overlaps the common source layer in the second horizontal direction.

10. The semiconductor device of claim 1, wherein the cell structure comprises:

a first conductive line connected to the first region of the common source layer; and a second conductive line connected to the second region of the common source layer, wherein a vertical level of each of the first conductive line and the second conductive line is higher than a vertical level of the channel layer.

11. A semiconductor device comprising:

a peripheral circuit structure; and a cell structure stacked on the peripheral circuit structure, wherein the cell structure comprises:

a plurality of gate electrodes, each of the gate electrodes being spaced apart from each other in a vertical direction;

a channel structure passing through the plurality of gate electrodes and extending in the vertical direction, the channel structure having a first end close to the peripheral circuit structure and a second end opposite to the first end; and a common source layer disposed above the plurality of gate electrodes and covering the second end of the channel structure, wherein the common source layer comprises:

a plurality of first regions, each first region being of a first conductivity type and extending in a first horizontal direction; and a plurality of second regions, each second region being of a second conductivity type different from the first conductivity type and extending in the first horizontal direction, wherein the first regions and the second regions are alternately arranged in a second horizontal direction crossing the first horizontal direction.

12. The semiconductor device of claim 11, wherein the cell structure comprises:

a cell region in which the plurality of gate electrodes and the channel structure are arranged;

a connection region located next to the cell region in the second horizontal direction; and a peripheral circuit connection region surrounding the cell region and the connection region.

13. The semiconductor device of claim 12, wherein the cell structure further comprises:

a first conductive line electrically connected to one of the plurality of first regions of the common source layer in the peripheral circuit connection region; and a second conductive line electrically connected to one of the plurality of second regions of the common source layer in the peripheral circuit connection region, wherein the first conductive line and the second conductive line extend in the second horizontal direction.

14. The semiconductor device of claim 11, wherein the cell structure comprises:

a cell region in which the plurality of gate electrodes and the channel structure are arranged;

a connection region located next to the cell region in the first horizontal direction; and a peripheral circuit connection region surrounding the cell region and the connection region.

15. The semiconductor device of claim 14, wherein the cell structure further comprises:

a first conductive line electrically connected to one of the plurality of first regions of the common source layer in the peripheral circuit connection region; and a second conductive line electrically connected to one of the plurality of second regions of the common source layer in the peripheral circuit connection region, wherein the first conductive line and the second conductive line extend in the second horizontal direction from the cell region to the peripheral circuit connection region.

16. The semiconductor device of claim 11, wherein the channel structure comprises a channel layer having a cylindrical shape and extending in the vertical direction, wherein the channel layer located at the second end of the channel structure vertically overlaps and is in contact with one of the first regions of the common source layer, and wherein the first conductivity type comprises P type.

17. The semiconductor device of claim 16, wherein a width of each of the first regions of the common source layer in the second horizontal direction is defined as a first width, wherein a width of the first end of the channel structure is defined as a second width, wherein a width of the second end of the channel structure is defined as a third width, wherein the second width is greater than the third width, and wherein the first width is less than the second width and greater than the third width.

18. A semiconductor device comprising:

a peripheral circuit structure; and a cell structure stacked on the peripheral circuit structure and comprising a cell region, a connection region, and a peripheral circuit connection region, wherein the cell structure comprises:

a plurality of gate electrodes, each of the gate electrodes being arranged in the cell region and spaced apart from each other in a vertical direction;

a channel structure passing through the plurality of gate electrodes in the cell region and extending in the vertical direction, the channel structure having a first end close to the peripheral circuit structure and a second end opposite to the first end;

a pad portion having a step shape and extending from the plurality of gate electrodes in the connection region;

a first plug connected to the pad portion, passing through the pad portion, and extending in the vertical direction;

a stack insulating layer surrounding the plurality of gate electrodes in a plan view;

a second plug passing through the stack insulating layer in the peripheral circuit connection region and extending in the vertical direction; and a common source layer located in the cell region and covering the second end of the channel structure, wherein the channel structure comprises a channel layer extending in the vertical direction, wherein the common source layer comprises a first region and a second region that contain impurities of different conductivity types, and wherein the first region of the common source layer comprises a P-type conductivity and is connected to at least a portion of the channel layer.

19. The semiconductor device of claim 18, wherein the common source layer extends from the cell region to the peripheral circuit connection region, and wherein the cell structure comprises:

a first conductive line electrically connected to the first region of the common source layer; and a second conductive line electrically connected to the second region of the common source layer, wherein the first plug is spaced apart from the first conductive line and the second conductive line, and wherein the second plug is connected to any one of the first conductive line and the second conductive line.

20. The semiconductor device of claim 18, wherein the second region of the common source layer is connected to the channel layer.

* * * * *